US012707643B2

(12) United States Patent
Lee et al.

(10) Patent No.: US 12,707,643 B2
(45) Date of Patent: Aug. 11, 2026

(54) THREE DIMENSIONAL SEMICONDUCTOR DEVICE AND METHOD OF MANUFACTURING THE SAME

(71) Applicant: Samsung Electronics Co., Ltd., Suwon-si (KR)

(72) Inventors: Jeon Il Lee, Suwon-si (KR); Kyunghwan Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 582 days.

(21) Appl. No.: 18/321,243

(22) Filed: May 22, 2023

(65) Prior Publication Data

US 2024/0107774 A1 Mar. 28, 2024

(30) Foreign Application Priority Data

Sep. 22, 2022 (KR) ........................ 10-2022-0120222

(51) Int. Cl.
*H10B 51/20* (2023.01)
*H10B 51/30* (2023.01)
*H10B 51/40* (2023.01)

(52) U.S. Cl.
CPC ............. *H10B 51/20* (2023.02); *H10B 51/30* (2023.02); *H10B 51/40* (2023.02)

(58) Field of Classification Search
CPC ........ H10B 51/00; H10B 51/10; H10B 51/20; H10B 51/30; H10B 51/40
See application file for complete search history.

(56) References Cited

U.S. PATENT DOCUMENTS

| | | | | |
|---|---|---|---|---|
| 11,133,329 | B2 | 9/2021 | Lue | |
| 11,251,199 | B2 | 2/2022 | Zhang et al. | |
| 2016/0260732 | A1* | 9/2016 | Lue | H10B 43/27 |
| 2021/0399017 | A1 | 12/2021 | Sun et al. | |
| 2021/0407845 | A1 | 12/2021 | Wang et al. | |
| 2021/0408045 | A1 | 12/2021 | Chiang et al. | |
| 2021/0408047 | A1 | 12/2021 | Wang et al. | |
| 2022/0005830 | A1 | 1/2022 | Wu et al. | |
| 2022/0020771 | A1 | 1/2022 | Yang et al. | |

(Continued)

FOREIGN PATENT DOCUMENTS

| | | | | |
|---|---|---|---|---|
| CN | 111386607 A | * 7/2020 | | H10D 64/037 |
| CN | 114256265 A | * 3/2022 | | H10D 30/69 |

*Primary Examiner* — Matthew E Warren
(74) *Attorney, Agent, or Firm* — Harness, Dickey & Pierce, P.L.C.

(57) ABSTRACT

A semiconductor memory device includes first through structures on a substrate, the first through structures arranged in a first direction, an electrode adjacent to the first through structures and extending horizontally in the first direction along the first through structures, and a ferroelectric layer interposed between the electrode and the first through structures. Each of the first through structures includes a first conductive pillar and a second conductive pillar spaced apart from each other in the first direction, a channel layer extending from a sidewall of the first conductive pillar to a sidewall of the second conductive pillar, the channel layer interposed between the ferroelectric layer and the first and second conductive pillars, the first and second conductive pillars being spaced apart from each other in the first direction and defining a first air gap. Adjacent ones of the first through structures define a second air gap.

20 Claims, 30 Drawing Sheets

(56) References Cited

U.S. PATENT DOCUMENTS

| | | | | |
|---|---|---|---|---|
| 2022/0037253 | A1 | 2/2022 | Yang et al. | |
| 2023/0067455 | A1* | 3/2023 | Wang | H10D 62/115 |
| 2023/0282283 | A1* | 9/2023 | Harari | H10D 30/6755<br>257/295 |
| 2023/0292522 | A1* | 9/2023 | Ha | H10B 51/20 |
| 2023/0371266 | A1* | 11/2023 | Kajimoto | H10B 51/20 |

* cited by examiner

ST3
FE IL EL IL EL IL EL IL
TRS2
CAP1 AG1 SEL
TRS1
SLP SEL
CNT
M
EL
ST2
IL
CSTR2
CSTR1
A'
A
SL1
ILD2
IL
EL FE SEL
MEC3
MEC2
MEC1
ILD1
SUB
ST1
D3
D2

ST3
IL EL IL EL IL EL IL
TR FE
ST2
SFL1
IL EL IL EL IL EL IL
SFL1 FE
TR SFL1
A'
A
IL EL IL EL IL EL IL ILD1 SUB
ST1

ST3

IL EL IL EL IL EL IL

A'

CRO2 FE

ST2

IL EL IL EL IL EL IL

TR SFL1 FE

IL EL IL EL IL EL IL ILD1 SUB

A

ST1

ST3
FE
IL
EL
IL
EL
IL
EL
IL
TRS2
SFL2 SEL
TRS1
SLP SEL
EL
ST2
IL
CSTR2
CSTR1
A'
A
IL
EL
FE
SEL
MEC3
MEC2
MEC1
ILD1
SUB
ST1
D3
D2

THREE DIMENSIONAL SEMICONDUCTOR DEVICE AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2022-0120222, filed on Sep. 22, 2022, in the Korean Intellectual Property Office, the entire contents of which are hereby incorporated by reference.

BACKGROUND

Various example embodiments relate to a three-dimensional semiconductor memory device and/or a method of manufacturing the same, and more particularly, relate to a three-dimensional ferroelectric memory device and/or a method of manufacturing the same.

Generally, a semiconductor memory device may be classified into a volatile memory device and a nonvolatile memory device. The volatile memory device loses stored data when power supply is interrupted and examples thereof include a dynamic random access memory (DRAM), a static RAM (SRAM), and/or the like. The nonvolatile memory device does not lose stored data even when power supply is interrupted and examples thereof include a programmable read only memory (PROM), an erasable PROM (EPROM), an electrically EPROM (EEPROM), a flash memory, and/or the like. Recently, developments have been actively made on next-generation semiconductor memory devices such as a magnetic random access memory (MRAM), a phase change random access memory (PRAM), and a ferroelectric random access memory (FeRAM) in accordance with the tendency toward high performance and/or low power of the semiconductor memory device. As high integration and high performance of the semiconductor device are required, various studies using semiconductor devices having different characteristics are being conducted.

SUMMARY

Various example embodiments provide a three-dimensional semiconductor memory device with improved electrical characteristics.

Alternatively or additionally, various example embodiments provide a method of manufacturing a three-dimensional semiconductor memory device having improved electrical characteristics.

A three-dimensional semiconductor memory device according to various example embodiments may include first through structures on a substrate, the first through structures arranged in a first direction, an electrode adjacent to the first through structures and extending horizontally in the first direction along the first through structures, and a ferroelectric layer interposed between the electrode and the first through structures. Each of the first through structures may include a first conductive pillar and a second conductive pillar spaced apart from each other in the first direction, and a channel layer extending from a sidewall of the first conductive pillar to a sidewall of the second conductive pillar, the channel layer being interposed between the ferroelectric layer and the first and second conductive pillars. The first and second conductive pillars may be spaced apart from each other in the first direction and may define a first air gap. Adjacent ones of the first through structures may define a second air gap.

A three-dimensional semiconductor memory device according to some example embodiments may include an electrode structure on a substrate, the electrode structure including a plurality of electrodes spaced apart from each other and stacked on the substrate, first conductive pillars penetrating the electrode structure, second conductive pillars penetrating the electrode structure, the first and second conductive pillars alternately arranged in a first direction, with air gaps respectively interposed between the first and second conductive pillars adjacent to each other, a ferroelectric layer interposed between the first and second conductive pillars and the electrode structure, and a channel layer interposed between the first and second conductive pillars and the ferroelectric layer.

A three-dimensional semiconductor memory device according to some example embodiments may include a first electrode structure and a second electrode structure on a substrate, each of the first and second electrode structures including a plurality of electrodes spaced apart from each other and stacked on the substrate, the first and second electrode structures extending in a first direction, and the first and second electrode structures spaced apart from each other in a second direction crossing the first direction, a through structure between the first and second electrode structures, a first cell string between the first electrode structure and the through structure, a second cell string between the second electrode structure and the through structure, and having a first air gap between the first cell string and the second cell string. The through structure may include a first conductive pillar and a second conductive pillar spaced apart from each other in the first direction, each of the first and second cell strings may include a channel layer connecting the first and second conductive pillars and a ferroelectric layer between the channel layer and an adjacent one of the first and second electrode structures, and the first air gap may be surrounded by the channel layer of the first cell string, the channel layer of the second cell string, the first conductive pillar, and the second conductive pillar.

BRIEF DESCRIPTION OF THE DRAWINGS

Various example embodiments will be more clearly understood from the following brief description taken in conjunction with the accompanying drawings. The accompanying drawings represent non-limiting, example embodiments as described herein.

DETAILED DESCRIPTION

Figure 1:
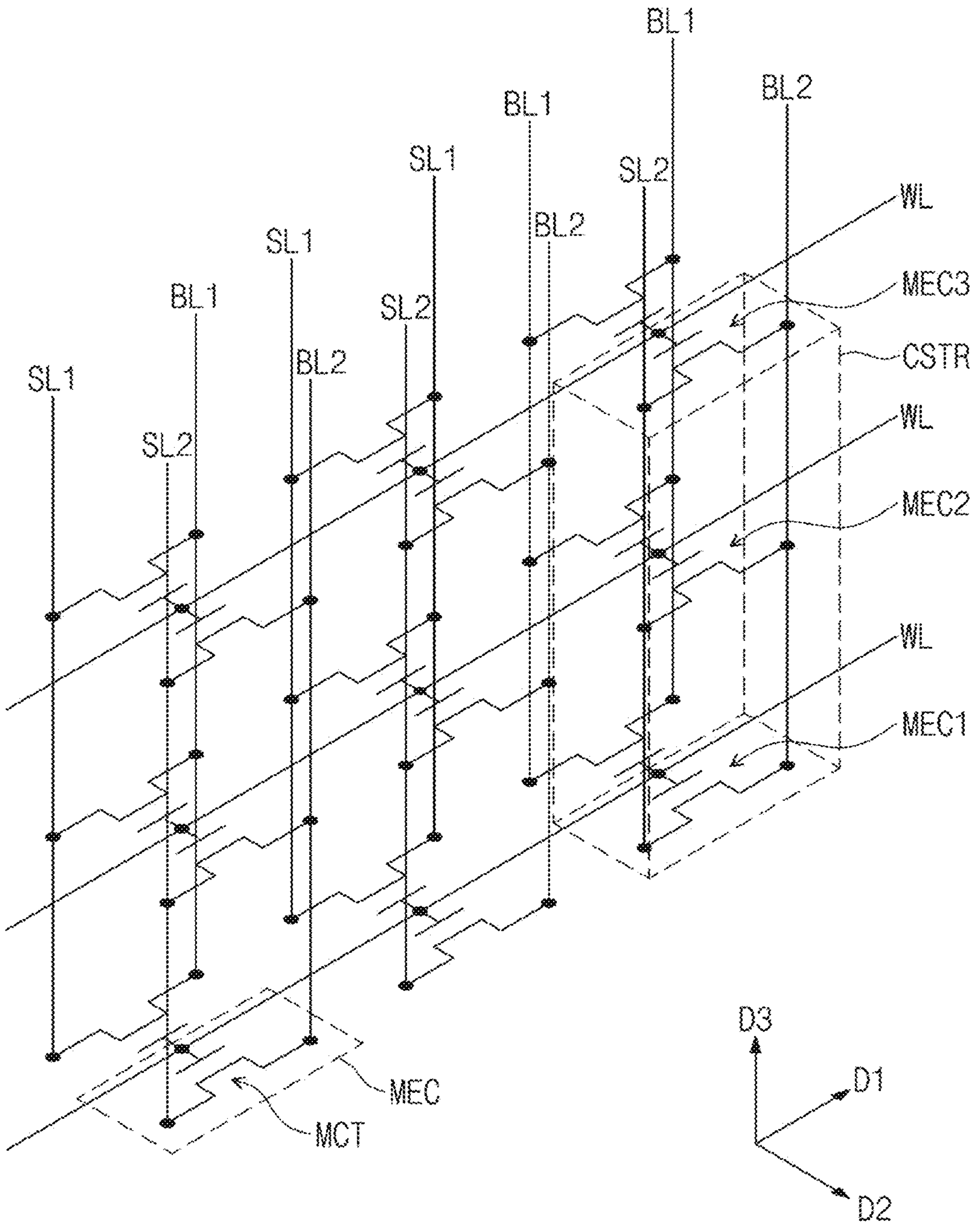
FIG. 1 is a simplified circuit diagram illustrating a cell array of a three-dimensional semiconductor memory device according to some example embodiments.

FIG. 1 is a simplified circuit diagram illustrating a cell array of a three-dimensional semiconductor memory device according to some example embodiments. Referring to FIG. 1, a three-dimensional semiconductor memory device according to some example embodiments may include word lines WL, bit lines BL, source lines SL, and memory cell transistors MCT.

The bit and source lines BL and SL may extend, e.g. vertically extend in a third direction D3. The bit lines BL may include a pair of first and second bit lines BL1 and BL2 adjacent to each other in a second direction D2. The source lines SL may include a pair of first and second source lines SL1 and SL2 adjacent to each other in the second direction D2. The second direction D2 may be a horizontal direction, and may be perpendicular to the first direction D1; however, example embodiments are not limited thereto.

The first bit lines BL1 and the first source lines SL1 may be alternately arranged in a first direction D1. The second bit lines BL2 and the second source lines SL2 may be alternately arranged in the first direction D1. The first direction D1 may be a horizontal direction, and may be perpendicular to either or both of the second direction D2 and the third direction D3; however, example embodiments are not limited thereto.

The word line WL may be provided between adjacent first and second bit lines BL1 and BL2 and between adjacent first and second source lines SL1 and SL2. The word line WL may horizontally extend in the first direction D1. The plurality of word lines WL may be vertically stacked in the third direction D3.

The memory cell transistor MCT may be provided between the first source line SL1 and the first bit line BL1 adjacent thereto. A source terminal of the memory cell transistor MCT may be connected to the first source line SL1, and a drain terminal of the memory cell transistor MCT may be connected to the first bit line BL1. A gate terminal of the memory cell transistor MCT may be connected to the word line WL. The memory cell transistor MCT may constitute one memory cell MEC. The memory cell MEC according to some example embodiments may be or may correspond to a unit cell of a ferroelectric random access memory (FeRAM).

The memory cell transistor MCT may be provided between the second source line SL2 and the second bit line BL2 adjacent thereto. A source terminal of the memory cell transistor MCT may be connected to the second source line SL2, and a drain terminal of the memory cell transistor MCT may be connected to the second bit line BL2. A gate terminal of the memory cell transistor MCT may be connected to the word line WL.

A plurality of memory cells MEC connected to the first source line SL1 and the first bit line BL1 may be stacked to form one cell string CSTR. A plurality of memory cells MEC connected to the second source line SL2 and the second bit line BL2 may be stacked to form or to correspond to one cell string CSTR. The stacked word lines WL may be connected to the cell string CSTR.

The cell string CSTR may be or may correspond to a vertical string extending in the third direction D3. The cell string CSTR may include stacked memory cells MEC, for example, first, second, and third memory cells MEC1, MEC2, and MEC3 sequentially stacked. In detail, a first memory cell MEC1 connected to the first source line SL1 and the first bit line BL1 and a first memory cell MEC1 connected to the second source line SL2 and the second bit line BL2 may be located at the same level (e.g. at the same vertical level) as each other. The first memory cell MEC1 connected to the first source line SL1 and the first bit line BL1 and the first memory cell MEC1 connected to the second source line SL2 and the second bit line BL2 may be commonly connected to one word line WL.

A plurality of cell strings CSTR connected to the first source line SL1 and the first bit line BL1 may be provided along the first source and bit lines SL1 and BL1. The plurality of cell strings CSTR may be arranged in the first direction D1 along the word line WL. A plurality of cell strings CSTR connected to the second source line SL2 and the second bit line BL2 may be provided along the second source and bit lines SL2 and BL2. The plurality of cell strings CSTR may be arranged in the first direction D1 along the word line WL.

As described above, the memory cells MEC according to various example embodiments may be arranged not only two-dimensionally but also three-dimensionally. For example, the memory device of FIG. 1 may be or may include or be included in a three-dimensional semiconductor memory device in which memory cells MEC are three-dimensionally arranged.

Each of the memory cells MEC may store data using a polarization state of a ferroelectric within the memory cells MEC. The ferroelectric within the memory cell MEC may be configured to be controlled to have one of a plurality of polarization states, and/or to output an electrical signal corresponding to each polarization state. For example, the ferroelectric within the memory cell MEC may store or output logical data such as '1' or '0' as data having a logical state.

The ferroelectric may be polarized in response to control signals applied to the word line WL, the bit line BL, and the source line SL. In detail, the word line WL, the bit line BL, and the source line SL may apply a voltage (e.g. a nonzero voltage such as a positive voltage), to the ferroelectric, and the polarization state of the ferroelectric may vary depending on a direction of an electric field applied to the ferroelectric. The data stored in the memory cell MEC may be read by comparing a current output to the bit line BL with a reference current. The polarization of the ferroelectric may be maintained when power, or power to the semiconductor device, is interrupted or stopped. For example, the three-dimensional semiconductor memory device according to some example embodiments may be or may include or be included in a non-volatile memory device.

Figure 2:
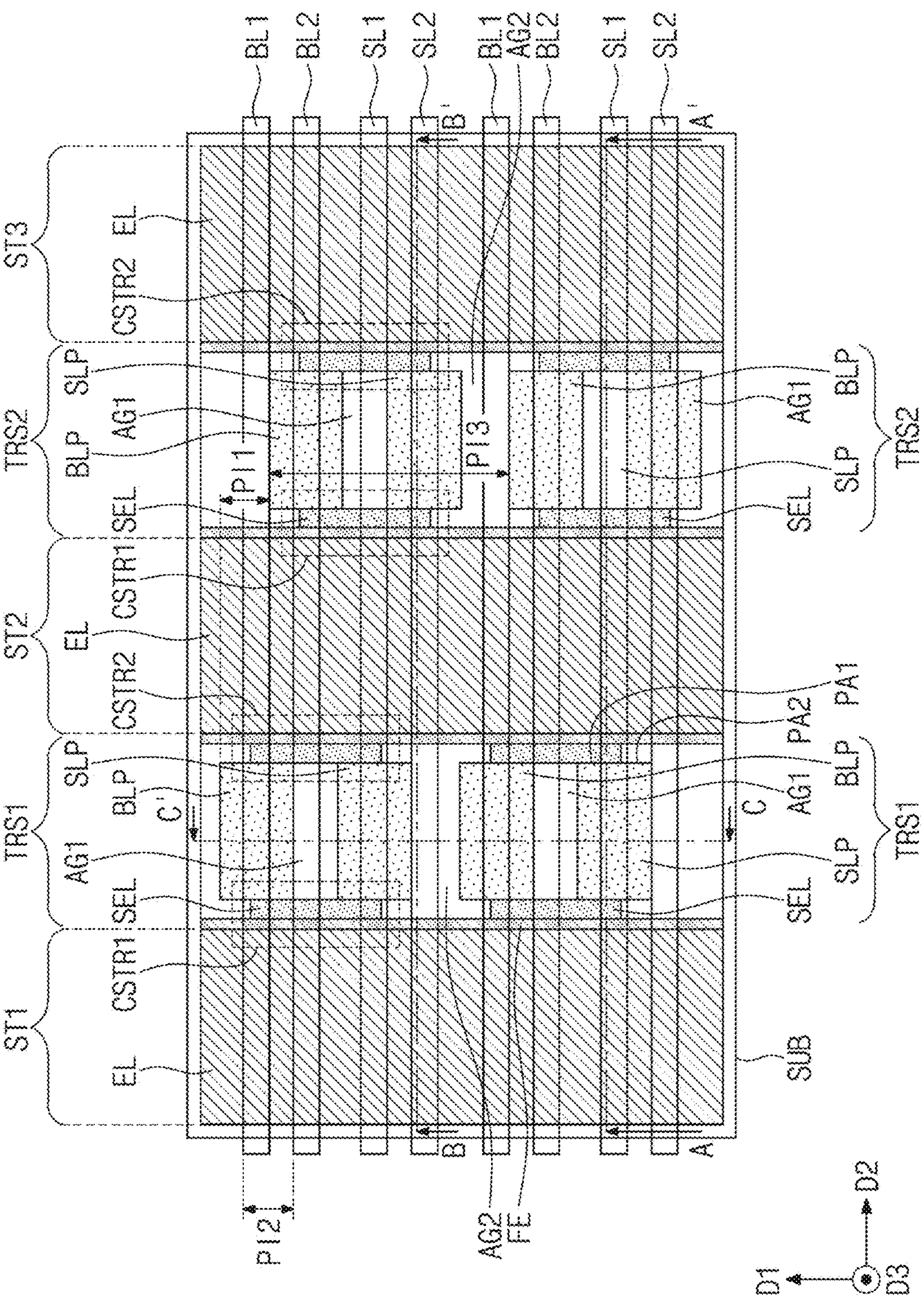
FIG. 2 is a plan view of a three-dimensional semiconductor memory device according to some example embodiments.
Figure 3A:
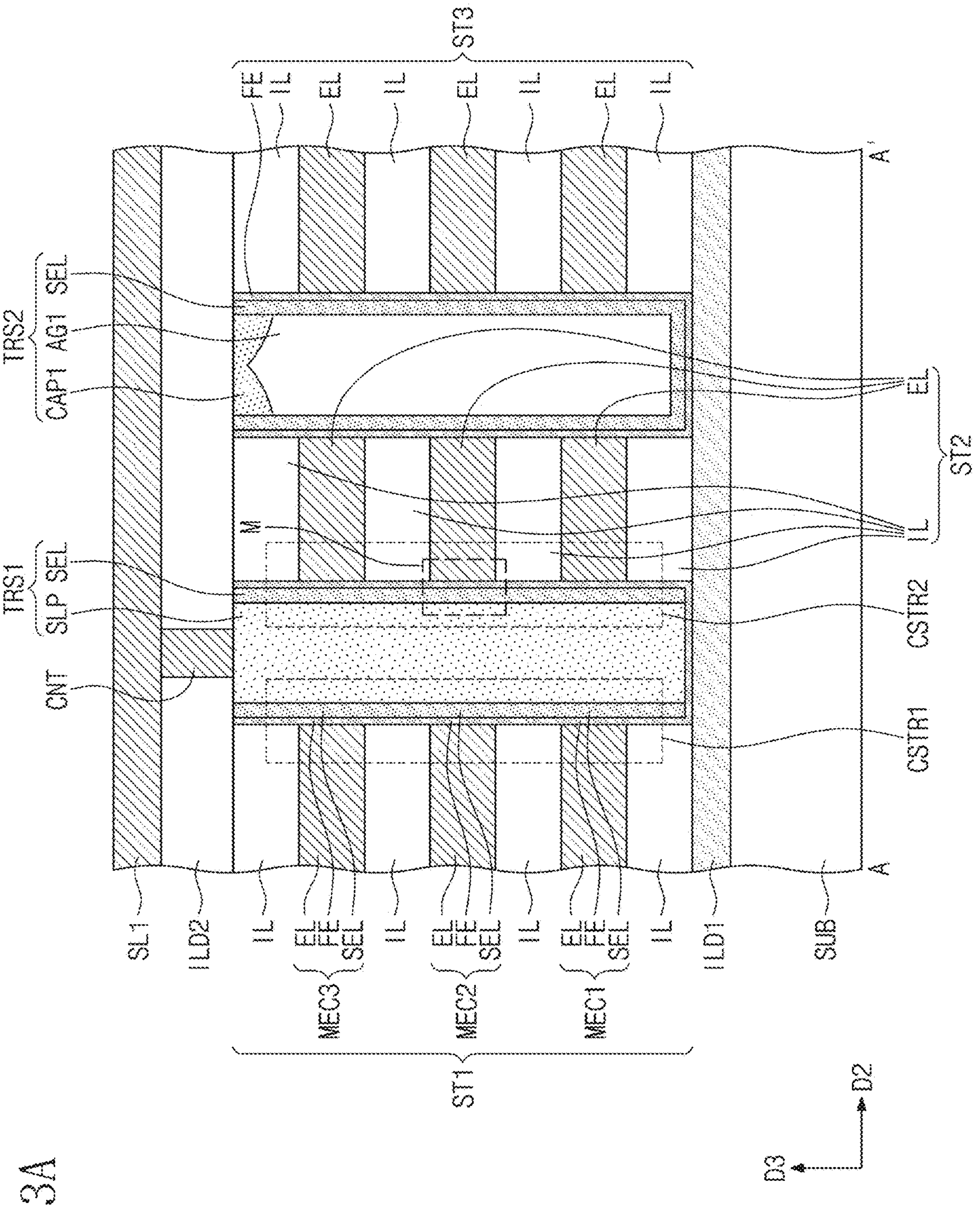
FIG. 3A is a cross-sectional view taken along line A-A' of FIG. 2.
Figure 3B:
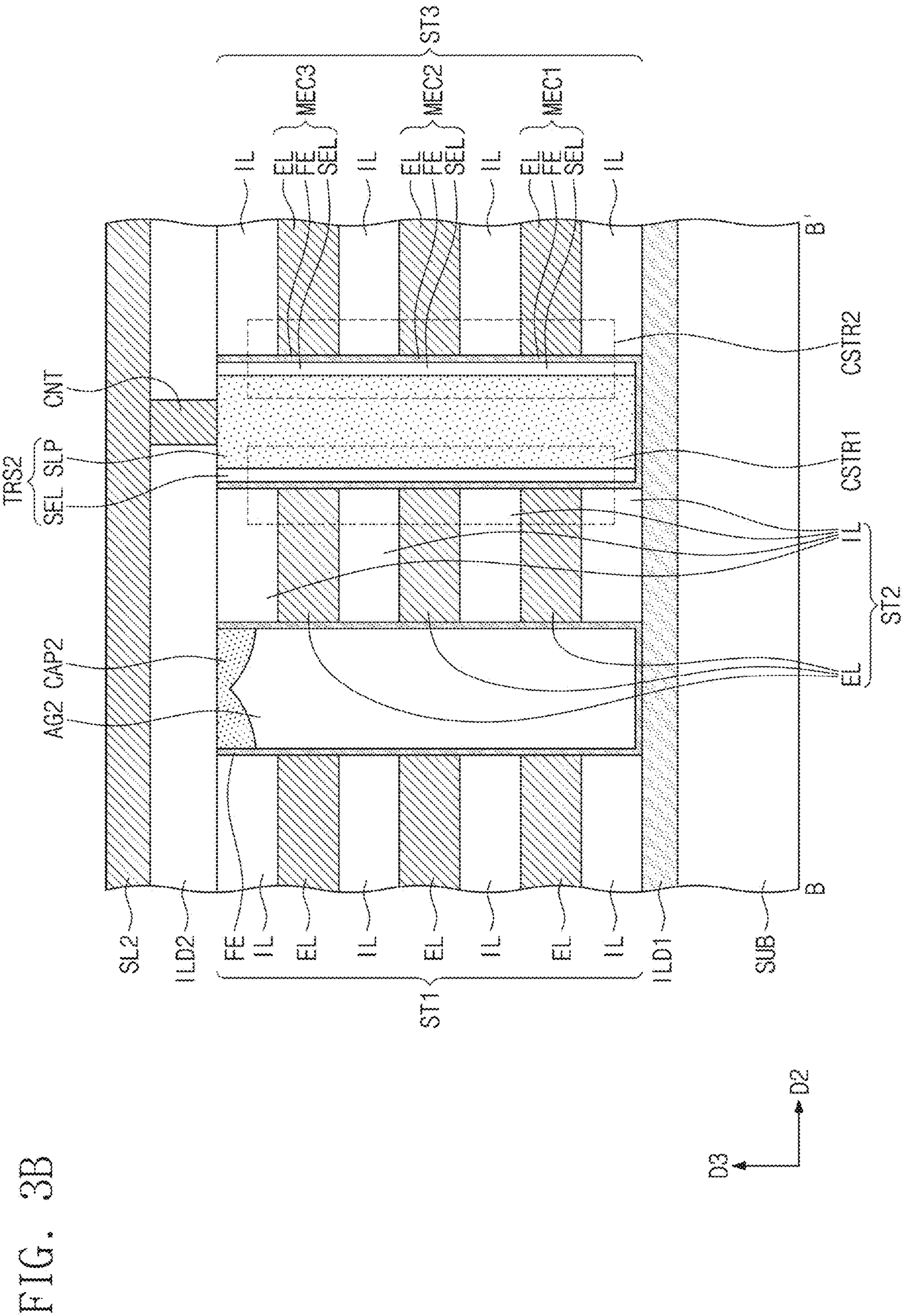
FIG. 3B is a cross-sectional view taken along line B-B' of FIG. 2.
Figure 3C:
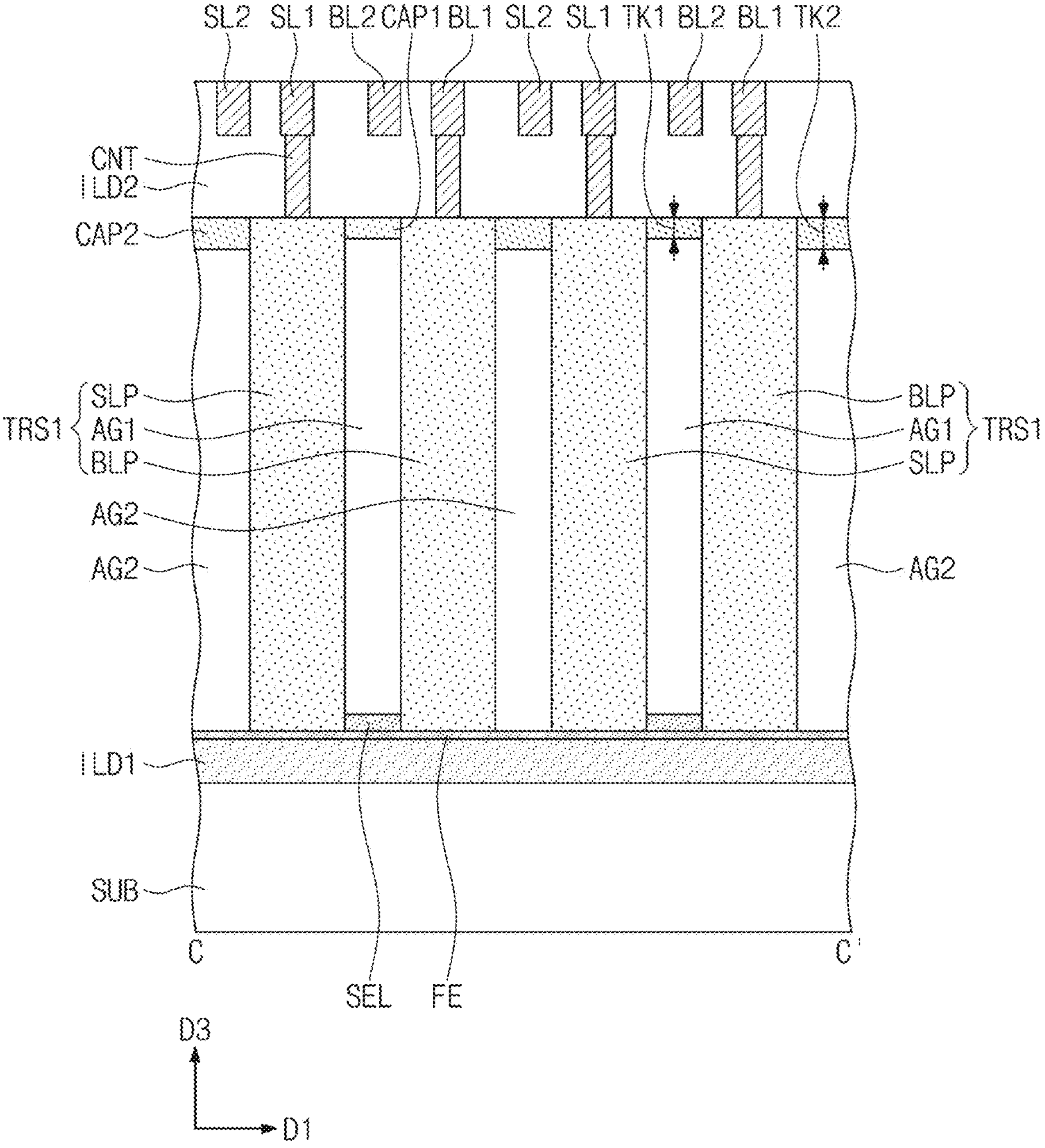
FIG. 3C is a cross-sectional view taken along line C-C' of FIG. 2.

FIG. 2 is a plan view of a three-dimensional semiconductor memory device according to some example embodiments. FIG. 3A is a cross-sectional view taken along line A-A' of FIG. 2. FIG. 3B is a cross-sectional view taken along line B-B' of FIG. 2. FIG. 3C is a cross-sectional view taken along line C-C' of FIG. 2.

Referring to FIGS. 2 and 3A to 3C, a first interlayer insulating layer ILD1 may be provided on a substrate SUB. First to third electrode structures ST1, ST2, and ST3 may be provided on the first interlayer insulating layer ILD1. The substrate SUB may include a semiconductor substrate or an insulating substrate. The semiconductor substrate may include, for example, one or more of a silicon substrate, a silicon-germanium substrate, a germanium substrate, and a single crystal epitaxial layer grown on a single crystal silicon substrate. The insulating substrate may include, for example, one or more of a sapphire substrate, a glass substrate, and a plastic substrate. The substrate SUB may be doped, or may be undoped; example embodiments are not limited thereto.

The first interlayer insulating layer ILD1 may be provided between the substrate SUB and the first to third electrode structures ST1, ST2, and ST3. The first interlayer insulating layer ILD1 may include one (e.g. only one) insulating layer or different stacked insulating layers. For example, the first interlayer insulating layer ILD1 may include at least one of a silicon oxide layer, a silicon nitride layer, and a silicon oxynitride layer. In some example embodiments, the first interlayer insulating layer ILD1 may be omitted.

The first to third electrode structures ST1, ST2, and ST3 may be spaced apart from each other in the second direction D2. Each of the first to third electrode structures ST1, ST2, and ST3 may extend in the first direction D1. When viewed from a plan view, each of the first to third electrode structures ST1, ST2, and ST3 may have a line shape extending in the first direction D1. A line width of each of the first to third electrode structures ST1, ST2, and ST3 may be uniform or may be constantly maintained.

Each of the first to third electrode structures ST1, ST2, and ST3 may include a plurality of stacked electrodes EL spaced apart from each other. An insulating layer IL may be interposed between electrodes EL that are vertically adjacent to each other. The stacked electrodes EL of example embodiments may correspond to the stacked word lines WL of FIG. 1.

For example, the electrodes EL may include one of a doped semiconductor material (e.g., doped silicon, doped germanium, etc.), conductive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.). The insulating layers IL may include one of silicon oxide, silicon nitride, and silicon oxynitride.

First through structures TRS1 may be provided between the first and second electrode structures ST1 and ST2. The first through structures TRS1 may be arranged in the first direction D1. Each of the first through structures TRS1 may include a first conductive pillar SLP, a second conductive pillar BLP, and a first air gap AG1 therebetween or defined therebetween. In some example embodiments, the first air gap AG1 may be at a low pressure, e.g. at vacuum pressure; however, example embodiments are not limited thereto. In some example embodiments, the first air gap AG1 may include air, such as clean, dry air (CDA); however, example embodiments are not limited thereto. The first through structures TRS1 may not extend a length of the substrate SUB, and may not be through-via structures.

The first and second conductive pillars SLP and BLP may include at least one selected from the group consisting of or including a doped semiconductor material, a conductive metal nitride, a metal, and a metal-semiconductor compound. The first air gap AG1 may be an empty space between the first and second conductive pillars SLP and BLP and may include, for example, air and may or may not include nitrogen.

The first and second conductive pillars SLP and BLP may have a pillar shape extending in a third direction D3. The first and second conductive pillars SLP and BLP may be spaced apart from each other in the first direction D1 with the first air gap AG1 therebetween. The first and second conductive pillars SLP and BLP may be interposed between the electrode EL of the first electrode structure ST1 and the electrode EL of the second electrode structure ST2. As various example embodiments, the first conductive pillar SLP may correspond to the first source line SL1 of FIG. 1. The second conductive pillar BLP may correspond to the bit line BL of FIG. 1.

Each of the first through structures TRS1 may further include a pair of channel layers SEL provided on both sides thereof. The channel layers SEL may extend in the third direction D3 along the first and second conductive pillars SLP and BLP. In a plan view shown in FIG. 2, the channel layer SEL may have a line shape or a bar shape extending from the first conductive pillar SLP to the second conductive pillar BLP through the first air gap AG1. The channel layer SEL may connect the first conductive pillars SLP and the second conductive pillars BLP to each other. The first air gap AG1 may be defined by or within a space surrounded by the first conductive pillar SLP, the second conductive pillar BLP, and the pair of channel layers SEL.

A ferroelectric layer FE may be provided between the first electrode structure ST1 and the first through structure TRS1. The ferroelectric layer FE may cover, e.g. directly cover the channel layer SEL. In a plan view shown in FIG. 2, the ferroelectric layer FE may have a line shape extending in the first direction D1 along a sidewall of the first electrode structure ST1. The ferroelectric layer FE may or may not also be provided between the second electrode structure ST2 and the first through structure TRS1.

Second through structures TRS2 may be provided between the second and third electrode structures ST2 and ST3. The second through structures TRS2 may be arranged in the first direction D1. Each of the second through structures TRS2 may include a first conductive pillar SLP, a second conductive pillar BLP, and a first air gap AG1 therebetween. The second through structure TRS2 may further include a pair of channel layers SEL provided on both sides thereof.

A ferroelectric layer FE may be provided between the second electrode structure ST2 and the second through structure TRS2. The ferroelectric layer FE may be provided between the third electrode structure ST3 and the second through structure TRS2.

The first through structures TSR1 may be provided on a first side of the second electrode structure ST2, and the second through structures TSR2 may be provided on a second side of the second electrode structure ST2. The first through structures TSR1 arranged in the first direction D1 may correspond to the alternately arranged first bit and source lines BL1 and SL1 in the first direction D1 described above with reference to FIG. 1. The second through structures TSR2 arranged in the first direction D1 may correspond to the alternately arranged second bit and source lines BL2 and SL2 in the first direction D1 described above with reference to FIG. 1. The stacked electrodes EL of the second electrode structure ST2 may correspond to the stacked word lines WL described above with reference to FIG. 1.

The first through structure TSR1 may not be aligned with the second through structure TSR2 adjacent thereto in a second direction D2, but be slightly offset in the first direction D1. The first through structure TSR1 may be connected to first bit and source lines BL1 and SL1 to be described later, and the second through structure TSR2 may be connected to second bit and source lines BL2 and SL2 to be described later, and thus the first through structure TSR1 and second through structure TSR2 may be offset, e.g. offset by a pitch between wirings in the first direction D1.

First to third memory cells MEC1, MEC2, and MEC3 may be respectively provided between the electrodes EL of the first electrode structure ST1 and the first through structure TSR1 (refer to FIG. 3A). The first to third memory cells MEC1, MEC2, and MEC3 between the first electrode structure ST1 and the first through structure TSR1 may be sequentially stacked to form a first cell string CSTR1. Although three memory cells MEC1, MEC2, and MEC3 are illustrated in FIGS. 3A-3C, example embodiments are not limited thereto, and there may be more, or less, memory cells according to various example embodiments.

The first to third memory cells MEC1, MEC2, and MEC3 may be provided between the electrodes EL of the second electrode structure ST2 and the first through structure TSR1, respectively. The first to third memory cells MEC1, MEC2, and MEC3 between the second electrode structure ST2 and the first through structure TSR1 may be sequentially stacked to form a second cell string CSTR2.

The first cell string CSTR1 may be provided on a first side of the first through structure TSR1, and the second cell string CSTR2 may be provided on a second side of the first through structure TSR1. The first cell string CSTR1 and the second cell string CSTR2 may also be provided on both sides of the second through structure TSR2 (refer to FIG. 3B).

In various example embodiments, each of the first to third memory cells MEC1, MEC2, and MEC3, for example, a unit cell may include an electrode EL, a channel layer SEL, and a ferroelectric layer FE. The electrode EL, the channel layer SEL, and the ferroelectric layer FE of the unit cell may constitute or correspond to the memory cell transistor MCT described in FIG. 1. The memory cell transistor MCT various example embodiments may include a thin layer transistor. The unit cell of various example embodiments may be a 1T (1 Transistor), e.g. a 1 FeT (one ferromagnetic transistor), memory cell.

The channel layer SEL may connect the first conductive pillar SLP and the second conductive pillar BLP to each other. For example, the first and second conductive pillars SLP and BLP separated by the first air gap AG1 may be electrically connected to each other through the channel layer SEL. The channel layer SEL may constitute a body of the memory cell transistor. The channel layer SEL may include a source region connected to the first conductive pillar SLP, a drain region connected to the second conductive pillar BLP, and a channel region between the source and drain regions.

The channel layer SEL may include at least one of a semiconductor material, an amorphous oxide semiconductor material, and a two-dimensional material. In some example embodiments, the channel layer SEL may include at least one selected from the group consisting of or including polysilicon such as doped or undoped polysilicon, doped silicon (Si), silicon germanium (SiGe), and epitaxial semiconductor, e.g. a semiconductor formed by selective epitaxial growth (SEG).

In some example embodiments, the channel layer SEL may include an amorphous oxide semiconductor. In detail, the channel layer SEL may include a compound of oxygen (O) and at least two metals selected from the group consisting of or including zinc (Zn), indium (In), gallium (Ga), and tin (Sn). For example, the channel layer SEL may include at least one selected from the group consisting of or including indium gallium zinc oxide (IGZO), indium tin zinc oxide (ITZO), Sn-IGZO, IWO, $CuS_2$, $CuSe_2$, $WSe_2$, IZO, ZTO, and YZO.

Alternatively or additionally, in some example embodiments, the channel layer SEL may include a two-dimensional material. In detail, the channel layer SEL may include metal chalcogenide, transition metal chalcogenide, graphene, or phosphorene. The metal chalcogenide or transition metal chalcogenide may be a metal compound represented by the formula MXy (e.g., "y" is an integer of 1, 2 or 3). In the above formula, "M" is a metal or transition metal atom, and may include, for example, W, Mo, Ti, Zn or Zr. "X" is a chalcogen atom and may include, for example, S, Se, O or Te. For example, the channel layer SEL may include one selected from the group consisting of or including graphene, phosphorene, $MoS_2$, $MoSe_2$, $MoTe_2$, $WS_2$, $WSe_2$, $WTe_2$, $ReS_2$, $ReSe_2$, $TiS_2$, $TiSe_2$, $TiTe_2$, ZnO, $ZnS_2$, $WO_3$, and $MoO_3$. The channel layer SEL may have a monolayer structure or a multi-layer structure in which 2 to 100 layers are stacked. The multi-layer structure may be implemented by combining a single layer and another single layer adjacent thereto by van der Waals forces.

The ferroelectric layer FE may be interposed between the channel layer SEL and the electrode EL. The ferroelectric layer FE may be conformally formed or conformally arranged along a profile of the channel layer SEL. The ferroelectric layer FE may have various polarization states in response to a voltage applied between the first and second conductive pillars SLP and BLP and the electrode EL. A thickness of the channel layer SEL may be greater than a thickness of the ferroelectric layer FE. For example, the ferroelectric layer FE may have a thickness of 5 nm to 20 nm.

The ferroelectric layer FE may include ferroelectricity. The ferroelectric layer FE may include a Hf compound having ferroelectric characteristics, for example, an Hf-based oxide. The Hf-based oxide having ferroelectric characteristics may further include at least one impurity selected from the group consisting of or including Zr, Si, Al, Y, Gd, La, Sc, and Sr. For example, the ferroelectric layer FE may include $HfO_2$, HfZnO, HfSiO, HfSiON, HfTaO, HfSiO, HfZrO, or combinations thereof. The ferroelectric layer FE may have an orthorhombic phase. The ferroelectric layer FE may include a single ferroelectric layer, a multi-layer in which two or more ferroelectric layers are stacked, or a multi-layer in which a ferroelectric layer and a dielectric layer are stacked.

Referring back to FIGS. 2 and 3A to 3C, a second air gap AG2 may be provided between adjacent first through structures TRS1. The second air gap AG2 may insulate adjacent first through structures TRS1. The second air gap AG2 may separate the first and second cell strings CSTR1 and CSTR2 on both sides of the first through structure TRS1 from the first and second cell strings CSTR1 and CSTR2 on both sides of the adjacent first through structure TRS1. The second air gap AG2 may also be provided between adjacent second through structures TRS2 to each other.

A first capping layer CAP1 may be provided on the first air gap AG1. A second capping layer CAP2 may be provided on the second air gap AG2. The first capping layer CAP1 may seal the first air gap AG1, and the second capping layer CAP2 may seal the second air gap AG2. The first and second capping layers CAP1 and CAP2 may include the same insulating material as each other and may be made of the same material; however, example embodiments are not limited thereto. For example, the first and second capping layers CAP1 and CAP2 may include one or more of silicon oxide, silicon nitride, and silicon oxynitride.

The first air gap AG1 and/or the second air gap AG2 may be provided between adjacent first and second conductive pillars SLP and BLP in the first direction D1. The first air gaps AG1 and the second air gaps AG2 may be alternately arranged in the first direction D1.

A width of the first air gap AG1 in the second direction D2 may be smaller than a width of the second air gap AG2 in the second direction D2 (refer to FIGS. 3A and 3B). This may be because the first air gap AG1 is surrounded by the channel layer SEL, while the second air gap AG2 is surrounded by the ferroelectric layer FE without the channel layer SEL.

Referring to FIG. 3C, a thickness, such as a minimum thickness TK1 of the first capping layer CAP1 may be smaller than a thickness, such as a minimum thickness TK2 of the second capping layer CAP2. This may be because the first capping layer CAP1 is formed thinner than the second capping layer CAP2 as a width of the first air gap AG1 is smaller than a width of the second air gap AG2.

As various example embodiments, referring to FIG. 2, a first portion PA1 of the sidewall of the first conductive pillar SLP may be in contact with the channel layer SEL. A remaining second portion PA2 of the sidewall of the first conductive pillar SLP may be in contact with the second air gap AG2. A first portion of a sidewall of the second conductive pillar BLP may be in contact with the channel layer SEL. A remaining second portion of the sidewall of the second conductive pillar BLP may be in contact with the second air gap AG2.

Referring back to FIGS. 2 and 3A to 3C, according to various example embodiments, upper surfaces of the first through structures TRS1 may be coplanar with an upper surface of an uppermost insulating layer IL of the electrode structures ST1, ST2, and ST3. Upper surfaces of the second through structures TRS2 may be coplanar with the upper surface of the uppermost insulating layer IL of the electrode structures ST1, ST2, and ST3. An uppermost surface of the channel layer SEL and an uppermost surface of the ferroelectric layer FE may be coplanar with the upper surface of the uppermost insulating layer IL of the electrode structures ST1, ST2, and ST3. An upper surface of each of the first and second capping layers CAP1 and CPA2 may be coplanar with the upper surface of the uppermost insulating layer IL of the electrode structures ST1, ST2, and ST3.

A second interlayer insulating layer ILD2 may be provided on the first to third electrode structures ST1, ST2, and ST3. A plurality of wirings extending in parallel in the second direction D2 may be provided on the second interlayer insulating layer ILD2. The plurality of wirings may include first and second bit lines BL1 and BL2 and first and second source lines SL1 and SL2.

The first source line SL1 and the second source line SL2 may be adjacent to each other in the first direction D1. The first source line SL1 may be electrically connected to the first conductive pillar SLP of the first through structure TRS1. The second source line SL2 may be electrically connected to the first conductive pillar SLP of the second through structure TRS2.

The first bit line BL1 and the second bit line BL2 may be adjacent to each other in the first direction D1. The first bit line BL1 may be electrically connected to the second conductive pillar BLP of the first through structure TRS1. The second bit line BL2 may be electrically connected to the second conductive pillar BLP of the second through structure TRS2.

The first and second source lines SL1 and SL2 may be respectively connected to the first conductive pillars SLP through contacts CNT. The first and second bit lines BL1 and BL2 may be respectively connected to the second conductive pillars BLP through the contacts CNT.

Referring back to FIG. 2, the first through structure TSR1 may be offset from the adjacent second through structure TSR2 by a first pitch PH in the first direction D1. A pitch between adjacent first and second source lines SL1 and SL2 may be a second pitch PI2. A pitch between adjacent first and second bit lines BL1 and BL2 may be the second pitch PI2. In this case, the first pitch PH may be substantially the same as the second pitch PI2. For example, a pitch of the second through structures TRS2 in the first direction D1 may be a third pitch PI3. The first pitch PH may be less than half (e.g., less than PI3/2) of the third pitch PI3.

The second cell string CSTR2 between the second electrode structure ST2 and the first through structure TSR1 may be offset from the first cell string CSTR1 between the second electrode structure ST2 and the second through structure TSR2 by the first pitch PH in the first direction D1. For example, the first and second cell strings CSTR1 and CSTR2 on both sides of the electrode EL may be slightly offset from each other in the first direction D1.

In the three-dimensional semiconductor memory device according to various example embodiments, the air gaps AG1 and AG2 may be provided between adjacent first and second conductive pillars SLP and BLP. As the air gaps AG1 and AG2 are air and have a very low dielectric constant, coupling between the first and second conductive pillars SLP and BLP may be reduced, e.g. may be greatly reduced. As a result, electrical characteristics of the semiconductor device may be improved through the air gaps AG1 and AG2.

In the three-dimensional semiconductor memory device according to various example embodiments, the electrode EL extending in the first direction D1 may connect the cell strings arranged in the first direction D1 in a line form without changing the line width. For example, as the line width of the electrode EL is maintained constant and large, resistance of the electrode EL may be reduced. As a result, electrical characteristics of the semiconductor device may be improved.

Figure 4:
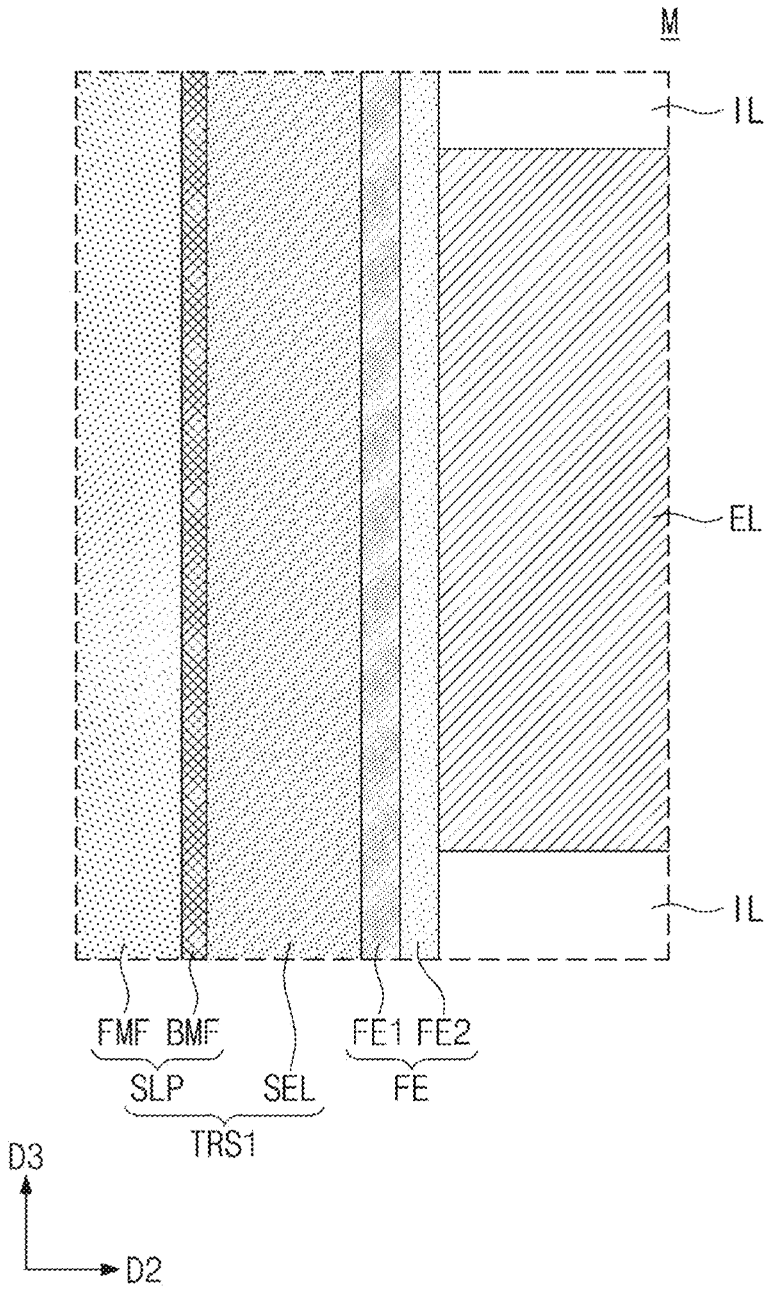
FIG. 4 is an enlarged cross-sectional view of region "M" of FIG. 3A for explaining a three-dimensional semiconductor memory device according to an embodiment of the inventive concept.

FIG. 4 is an enlarged cross-sectional view of region "M" of FIG. 3A for explaining a three-dimensional semiconductor memory device according to various example embodiments. Referring to FIGS. 3A and 4, memory cells MEC1, MEC2, and MEC3 according to example embodiments may include conductive pillars SLP and BLP, a ferroelectric layer FE, a channel layer SEL, and an electrode EL. The ferroelectric layer FE and the channel layer SEL may be interposed between the conductive pillars SLP and BLP and the electrode EL.

The conductive pillars SLP and BLP may include a filling metal FMF and a barrier metal BMF. A barrier metal BMF may be interposed between the filling metal FMF and the channel layer SEL. The filler metal FMF may include a low-resistance metal (e.g., one or more of tungsten, titanium, tantalum, etc.), and the barrier metal BMF may include a conductive metal nitride (e.g., one or more of titanium nitride, tantalum nitride, etc.). When the channel layer SEL includes a semiconductor material (e.g., silicon), a metal-silicide layer may be further provided between the barrier metal BMF and the channel layer SEL.

As described above, the ferroelectric layer FE may be a single ferroelectric layer, but the ferroelectric layer FE may be a multi-layer in which at least two layers are stacked, as shown in FIG. 4. For example, the ferroelectric layer FE may include a first layer FE1 and a second layer FE2.

In various example embodiments, both the first layer FE1 and the second layer FE2 may include a ferroelectric. In some example embodiments embodiment, one of the first and second layers FE1 and FE2 may include a ferroelectric and the other may include a paraelectric. The paraelectric may include at least one of silicon oxide and a metal oxide having a high dielectric constant. For example, the paraelectric may include at least one of hafnium oxide, zirconium oxide, and aluminum oxide, but is not limited thereto.

In some example embodiments, the first layer FE1 and the second layer FE2 may include the same material as each other (e.g. may be made of the same material). Nevertheless, the first layer FE1 may have ferroelectric characteristics, but the second layer FE2 may not have ferroelectric characteristics. For example, when both the first layer FE1 and the second layer FE2 include hafnium oxide, a crystal structure of hafnium oxide included in the first layer FE1 may be different from a crystal structure of hafnium oxide included in the second layer FE2. The first layer FE1 may have a thickness having ferroelectric characteristics. For example, the first layer FE1 may have a thickness of 0.5 to 10 nm, but is not limited thereto. As a thickness, e.g. a critical thickness representing ferroelectric characteristics may vary for each ferroelectric material, the thickness of the ferroelectric material layer may vary depending on the ferroelectric material.

In some example embodiments, the first layer FE1 and the second layer FE2 may include different materials. For example, the first layer FE1 may include hafnium oxide and may or may not include aluminum oxide, and the second layer FE2 may include aluminum oxide and may or may not include hafnium oxide.

In some example embodiments, the first layer FE1 and the second layer FE2 may be provided in plural and a plurality of first and second layers FE1 and FE2 may be alternately stacked. The plurality of first and second layers FE1 and FE2 alternately stacked may constitute one ferroelectric layer FE.

FIGS. 5, 7, 9, 11, 13, and 15 are plan views illustrating a method of manufacturing a three-dimensional semiconductor memory device according to some example embodiments. FIGS. 6, 8, 10, 12, 14A and 16A are cross-sectional views taken along line A-A' of FIGS. 5, 7, 9, 11, 13 and 15, respectively. FIGS. 14B and 16B are cross-sectional views taken along line B-B' of FIGS. 13 and 15, respectively. FIG. 16C is a cross-sectional view taken along line C-C' of FIG. 15.

Figure 5:
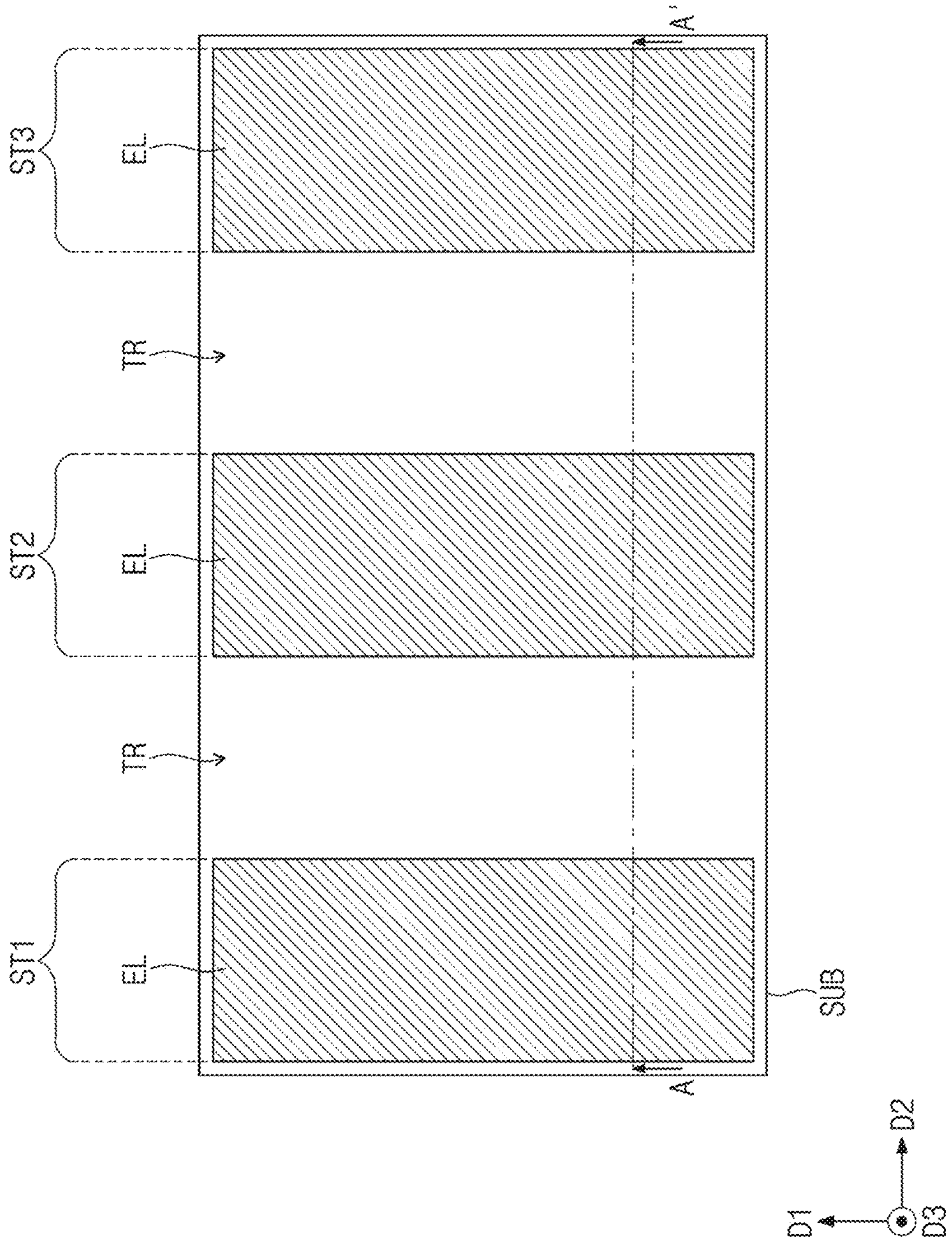
FIGS. 5, 7, 9, 11, 13, and 15 are plan views illustrating a method of manufacturing a three-dimensional semiconductor memory device according to some example embodiments.
Figure 6:
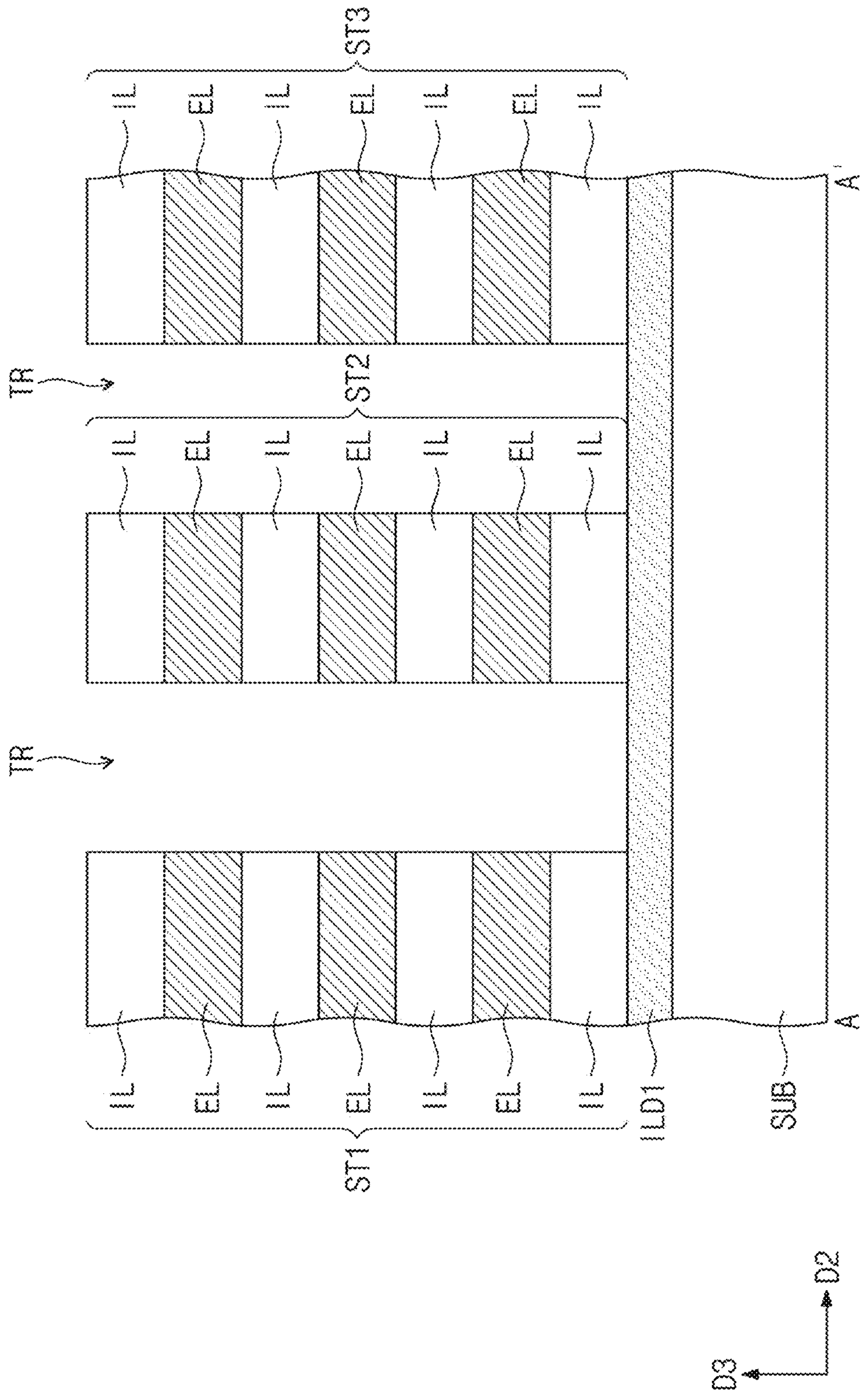
FIGS. 6, 8, 10, 12, 14A and 16A are cross-sectional views taken along line A-A' of FIGS. 5, 7, 9, 11, 13 and 15, respectively.

Referring to FIGS. 5 and 6, a first interlayer insulating layer ILD1 may be formed on a substrate SUB. The first interlayer insulating layer ILD1 may function as an etch stop layer. The first interlayer insulating layer ILD1 may include at least one of a silicon oxide layer, a silicon nitride layer, and a silicon oxynitride layer. The first interlayer insulating layer ILD1 may be omitted.

An electrode structure ST may be formed on the first interlayer insulating layer ILD1. Forming the electrode structure ST may include alternately stacking insulating layers IL and electrodes EL on the first interlayer insulating layer ILD1. The insulating layers IL may be formed of a silicon (Si)-based insulating material, and the electrodes EL may be formed of at least one of a doped semiconductor material, a metal, a conductive metal nitride, and a metal-semiconductor compound.

A plurality of electrode structures ST1, ST2, and ST3 extending in a first direction D1 may be formed by patterning the electrode structure ST. The plurality of electrode structures ST1, ST2, and ST3 may include first to third electrode structures ST1, ST2, and ST3 sequentially arranged in a second direction D2.

Forming the first to third electrode structures ST1, ST2, and ST3 may include anisotropically etching, e.g. dry etching, the electrode structure ST to form trenches TR penetrating the electrode structure ST. The trenches TR may have a line shape extending in the first direction D1. The trenches TR may expose the first interlayer insulating layer ILD1. For example, the first interlayer insulating layer ILD1 may be used as an etch stop layer in the anisotropic etching process.

The first and second electrode structures ST1 and ST2 may be spaced apart from each other in the second direction D2 with the trench TR interposed therebetween. The second and third electrode structures ST2 and ST3 may be spaced apart from each other in the second direction D2 with the trench TR interposed therebetween.

Figure 7:
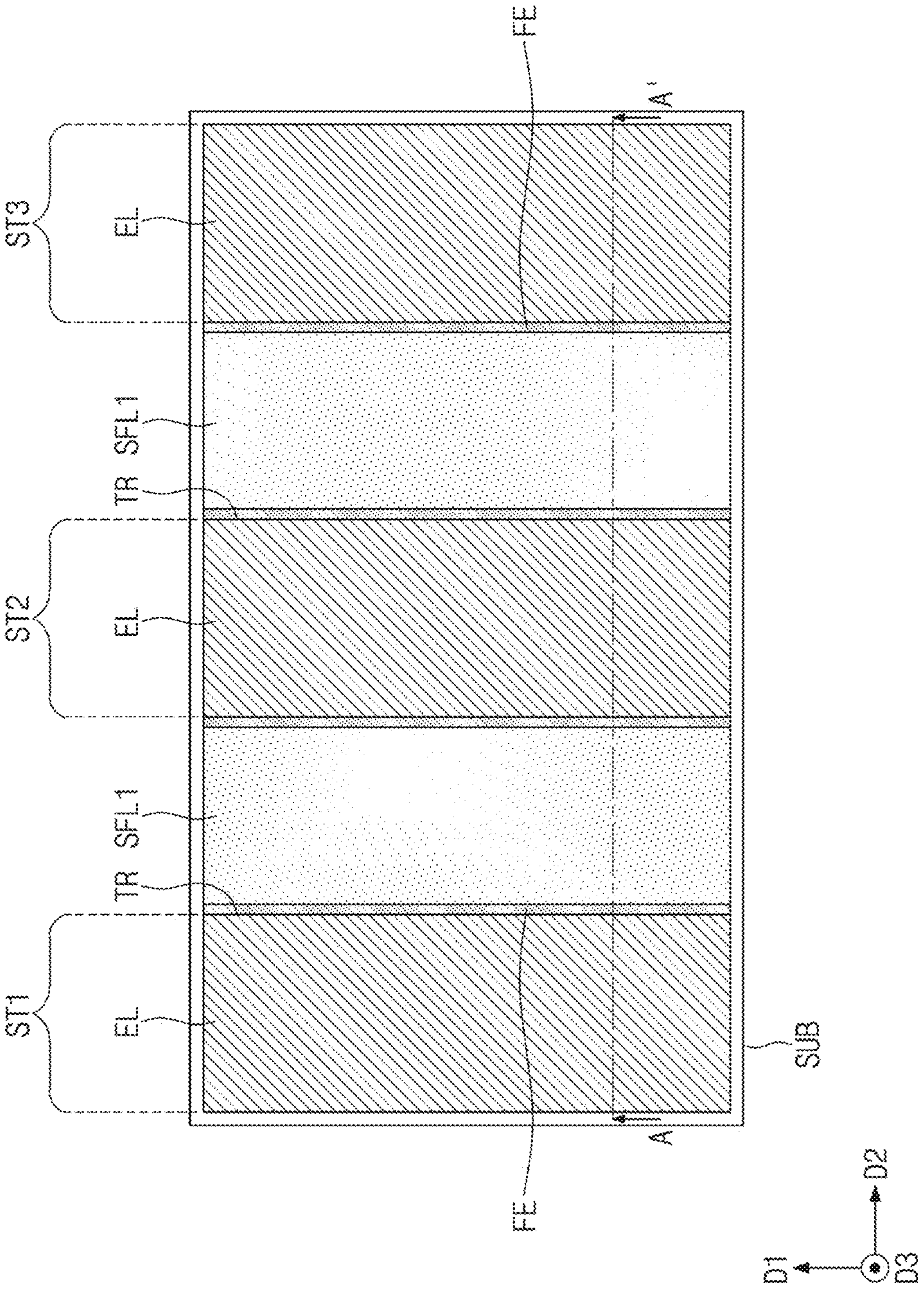
Figure 8:
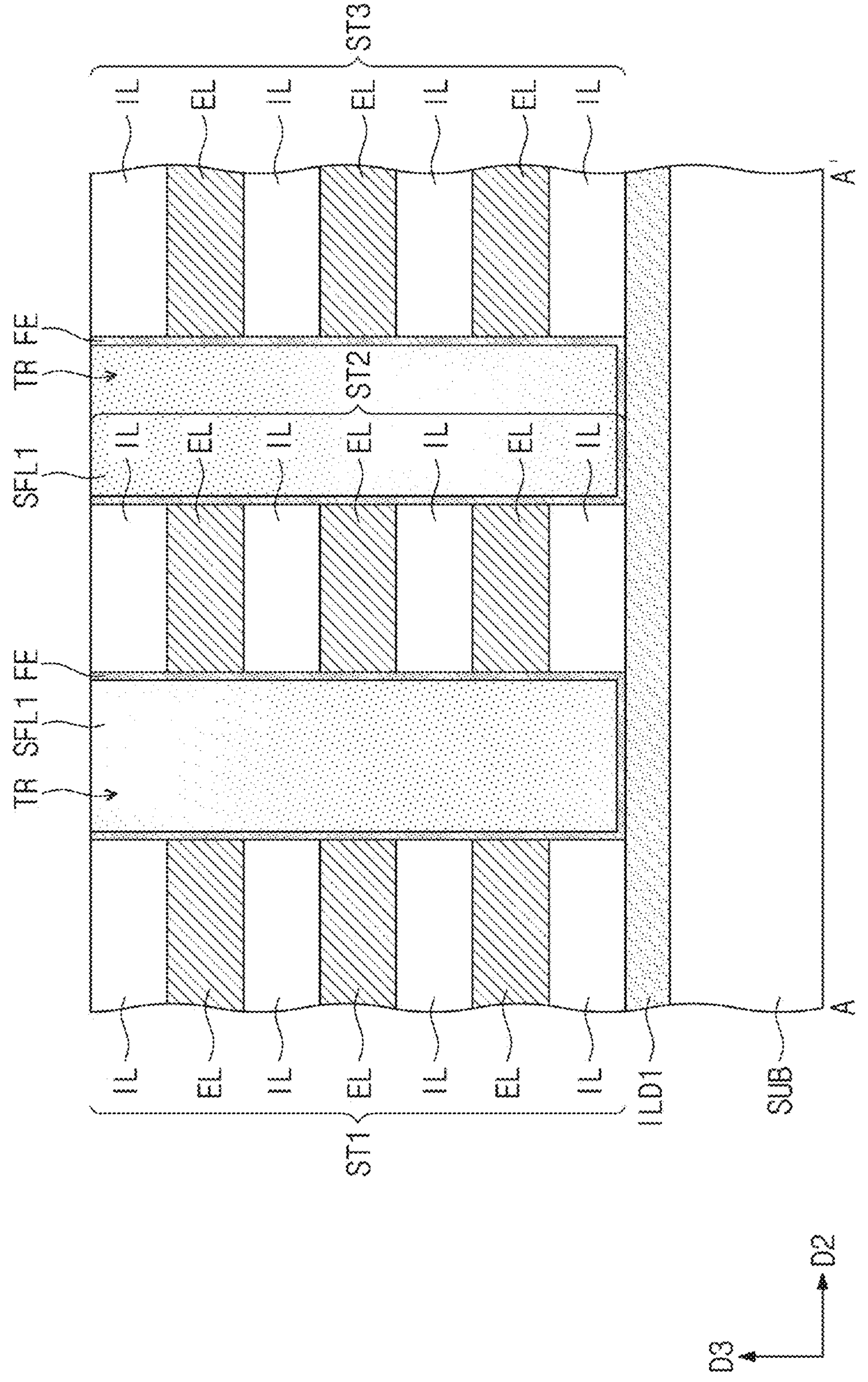

Referring to FIGS. 7 and 8, a ferroelectric layer FE may be conformally formed in the trench TR. The ferroelectric layer FE may be formed to directly cover sidewalls of each of the first to third electrode structures ST1, ST2, and ST3. The ferroelectric layer FE may be formed using a deposition process such as atomic layer deposition (ALD) and/or chemical vapor deposition (CVD). For example, the ferroelectric layer FE may be formed of a Hf-based compound having ferroelectric characteristics.

A first sacrificial layer SFL1 may be formed in the trench TR. The first sacrificial layer SFL1 may be formed on the ferroelectric layer FE. Forming the first sacrificial layer SFL1 may include forming a sacrificial layer filling the trench TR on the first to third electrode structures ST1, ST2, and ST3, and planarizing, e.g. planarizing with a chemical mechanical planarization (CMP) and/or an etch-back process, the sacrificial layer until upper surfaces of the first to third electrode structures ST1, ST2, and ST3 are exposed.

The first sacrificial layer SFL1 may be formed of an insulating material having etch selectivity with respect to, e.g. having a faster etch rate than, the insulating layers IL. The first sacrificial layer SFL1 may include at least one of a silicon oxide layer, a silicon nitride layer, and a silicon oxynitride layer. For example, the first sacrificial layer SFL1 may be formed of a silicon nitride layer.

Figure 9:
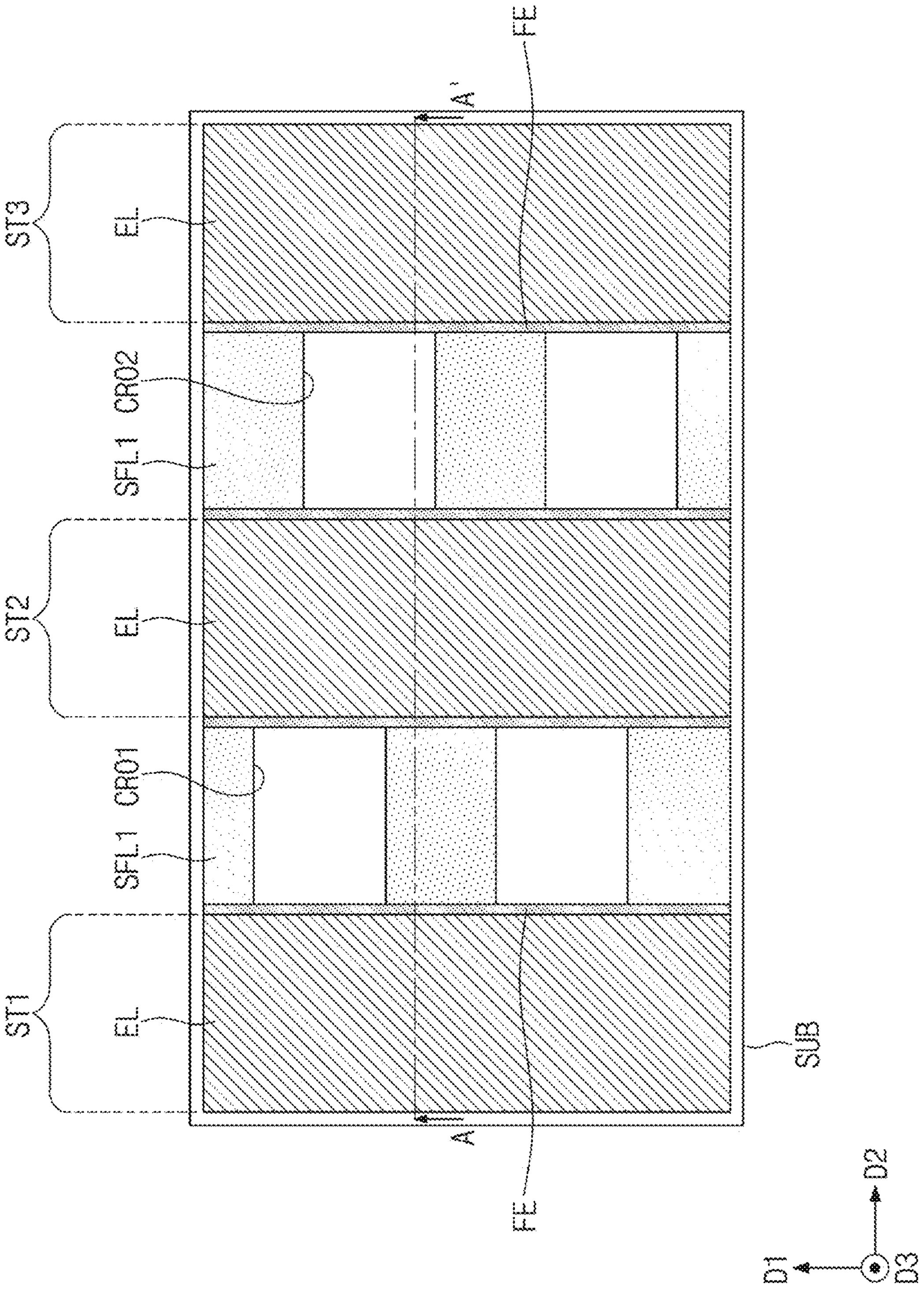
Figure 10:
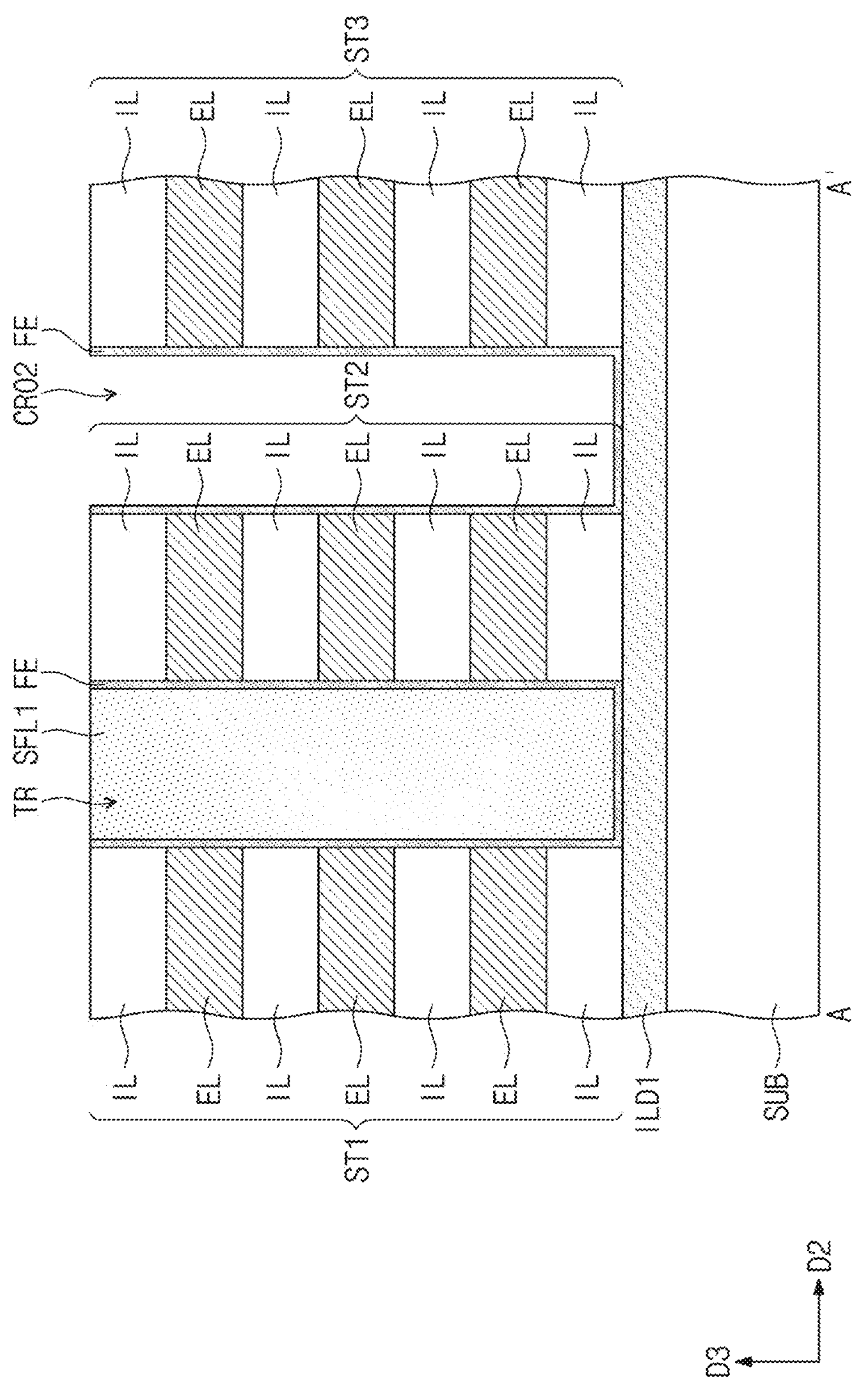

Referring to FIGS. 9 and 10, cell open holes CRO1 and CRO2 penetrating the first sacrificial layer SFL1 may be formed. Forming the cell open holes CRO1 and CRO2 may include forming a mask layer having openings on the first sacrificial layer SFL1 and anisotropically etching the first sacrificial layer SFL1 using the mask layer as an etch mask.

The cell open holes CRO1 and CRO2 may include first cell open holes CRO1 penetrating the first sacrificial layer SFL1 between the first and second electrode structures ST1 and ST2 and second cell open holes CRO2 penetrating the first sacrificial layer SFL1 between the second and third electrode structures ST2 and ST3. The first cell open holes CRO1 may be arranged in the first direction D1 between the first and second electrode structures ST1 and ST2. The second cell open holes CRO2 may be arranged in the first direction D1 between the second and third electrode structures ST2 and ST3.

The first cell open hole CRO1 may not be aligned with the second cell open hole CRO2 adjacent thereto, but be formed to be slightly offset. For example, the first cell open hole CRO1 may be slightly offset in the first direction D1 with respect to the second cell open hole CRO2 adjacent thereto. When viewed from a plan view, the first and second cell open holes CRO1 and CRO2 may be arranged in a zigzag shape.

Figure 11:
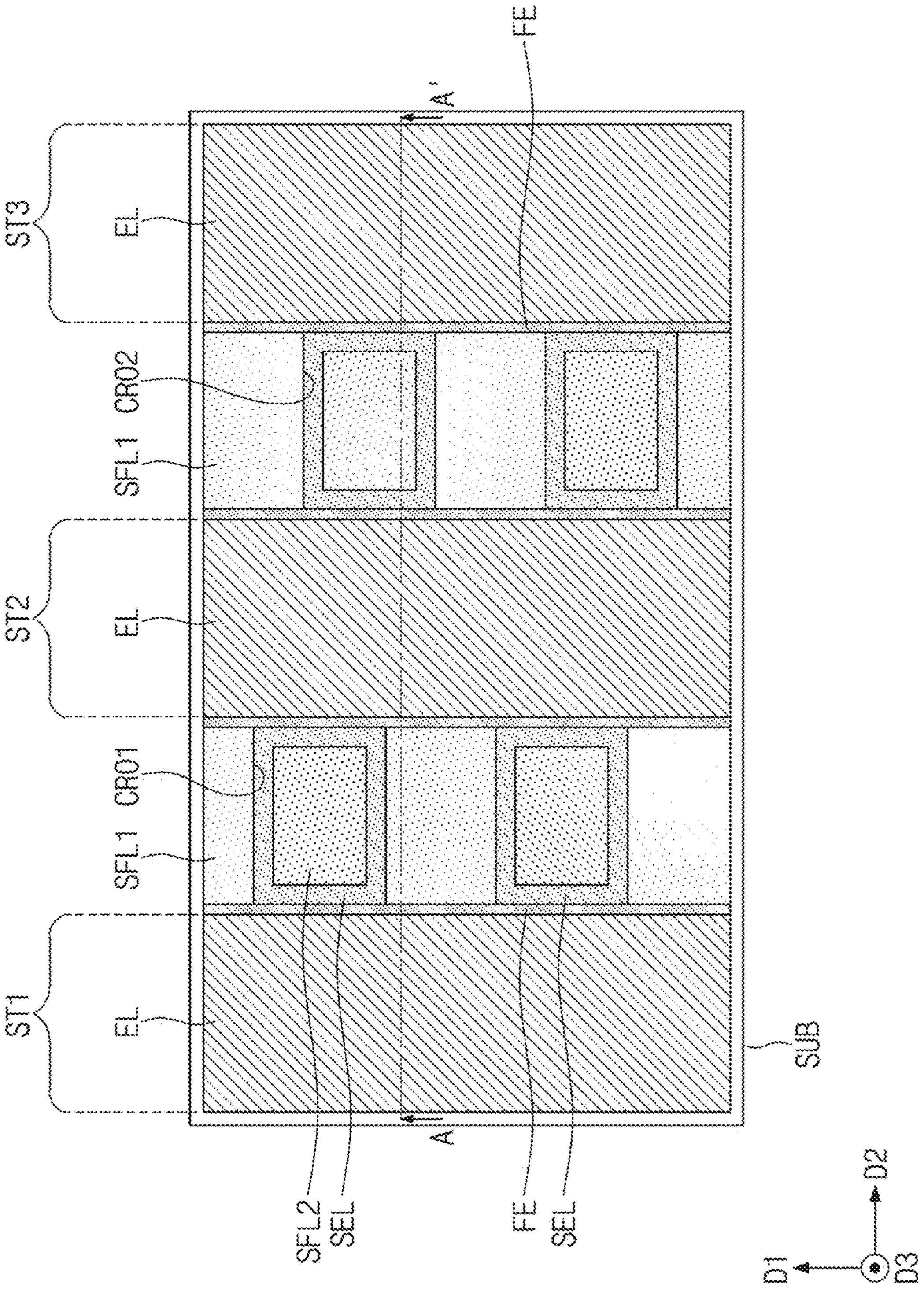
Figure 12:
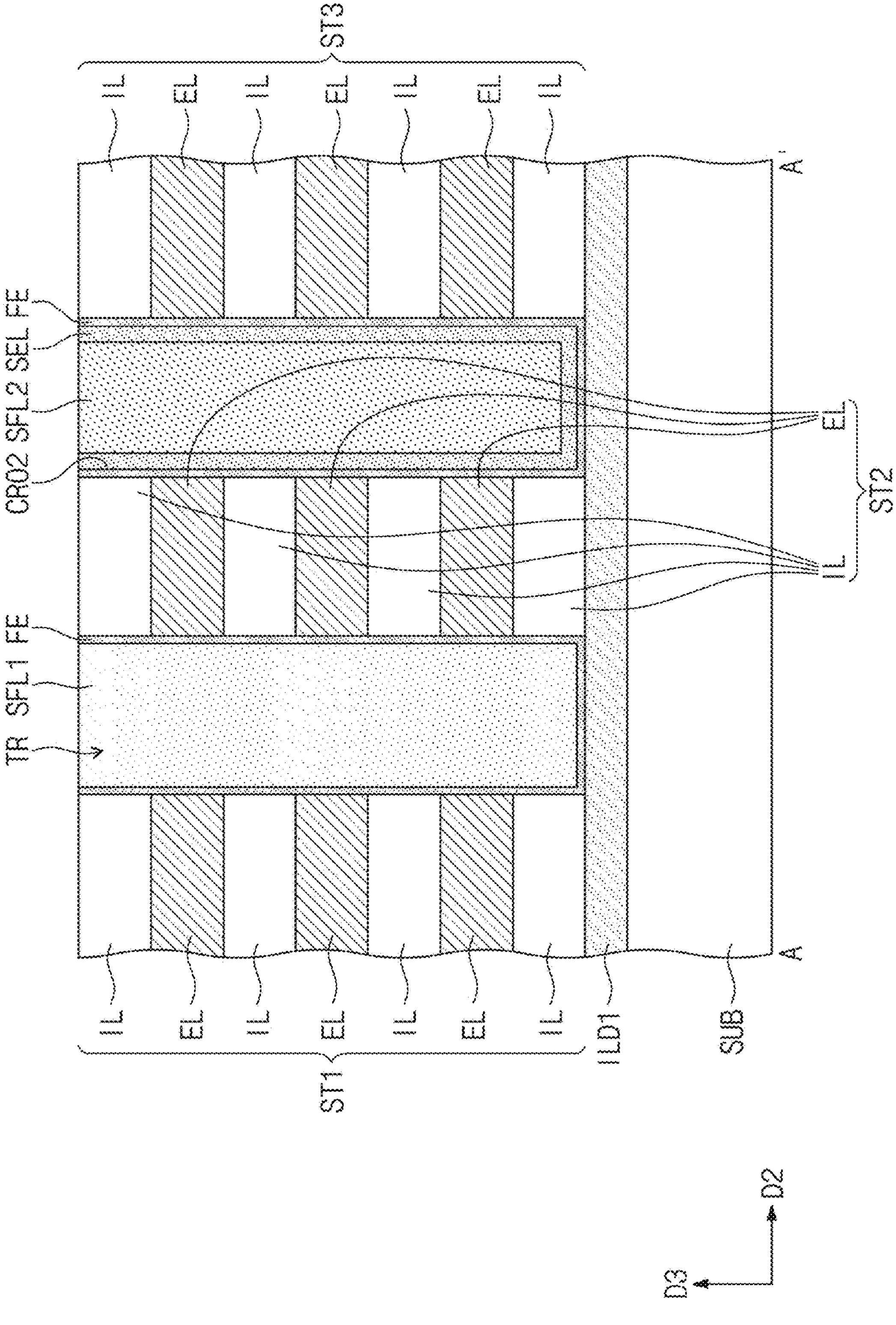

Referring to FIGS. 11 and 12, a channel layer SEL may be conformally formed in each of the first and second cell open holes CRO1 and CRO2. The channel layer SEL may be formed using a deposition process such as atomic layer deposition (ALD) and/or chemical vapor deposition (CVD). The channel layer SEL may be formed of at least one of a semiconductor material, an amorphous oxide semiconductor material, and a two-dimensional material. For example, the channel layer SEL may be formed of an amorphous oxide semiconductor such as IGZO.

A second sacrificial layer SFL2 may be formed in each of the first and second cell open holes CRO1 and CRO2. The second sacrificial layer SFL2 may be formed on the channel layer SEL. Forming the second sacrificial layer SFL2 may include forming a sacrificial layer filling the first and second cell open holes CRO1 and CRO2 on the first to third electrode structures ST1, ST2 and ST3, and planarizing with a CMP process and/or an etch back process to planarize the sacrificial layer until upper surfaces of the first to third electrode structures ST1, ST2, and ST3 are exposed. The second sacrificial layer SFL2 may include the same material as the first sacrificial layer SFL1.

Figure 13:
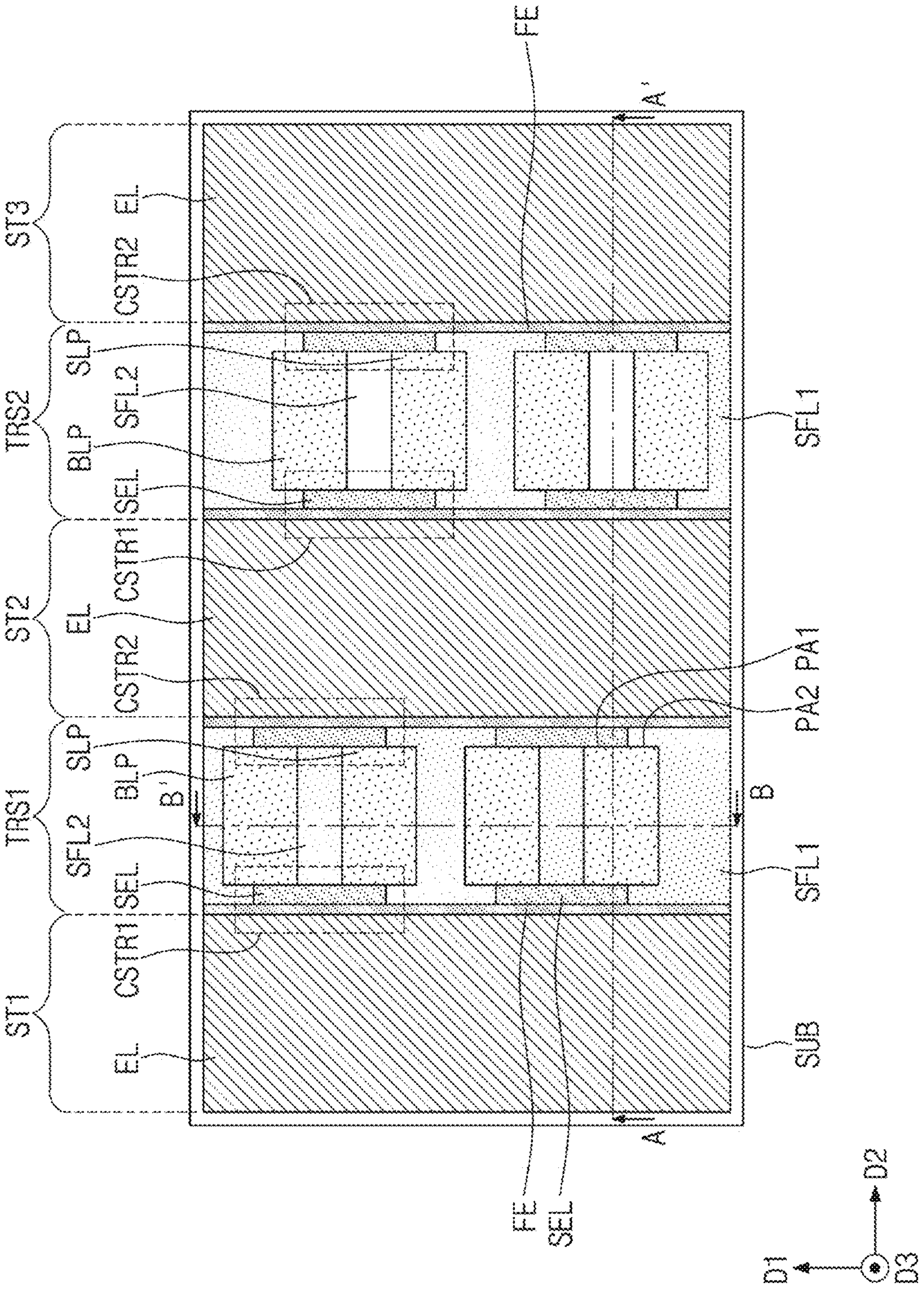
Figure 14A:
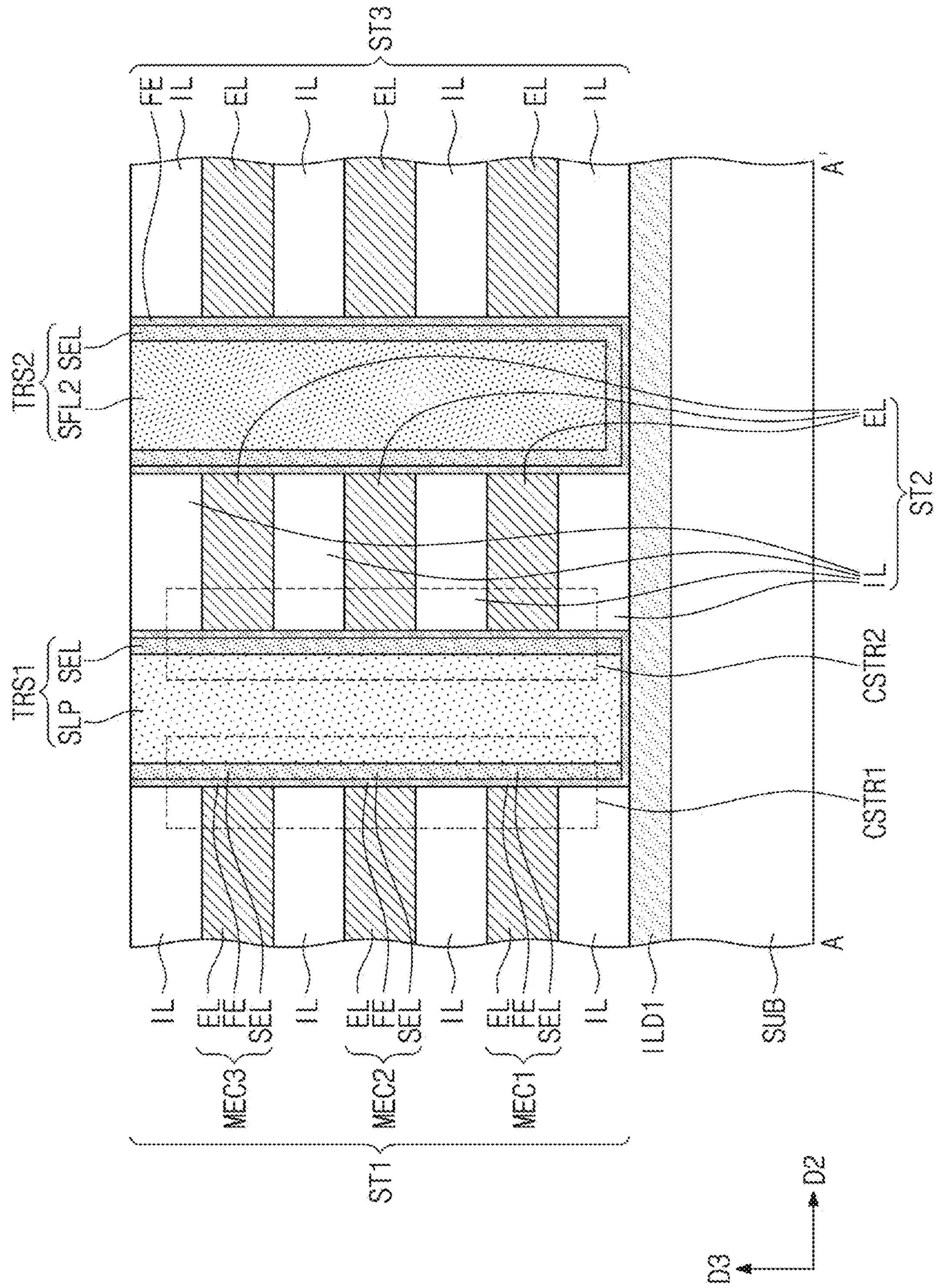
Figure 14B:
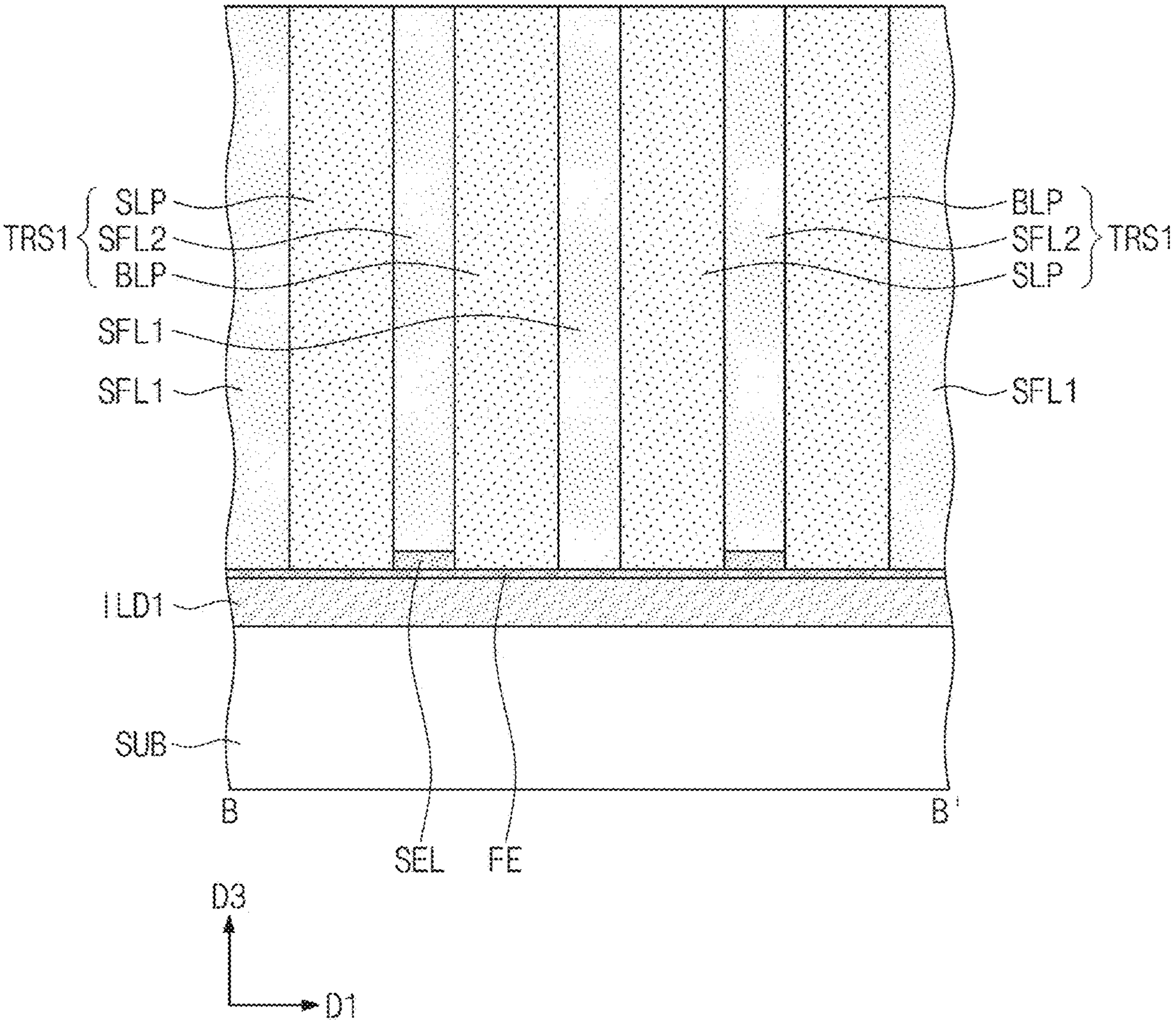
FIGS. 14B and 16B are cross-sectional views taken along line B-B' of FIGS. 13 and 15, respectively.

Referring to FIGS. 13, 14A, and 14B, a pair of first and second conductive pillars SLP and BLP passing through one cell open hole CRO1 and CRO2 may be formed. The second sacrificial layer SFL2 may remain between the first conductive pillar SLP and the second conductive pillar BLP.

Forming the first and second conductive pillars SLP and BLP may include forming through holes penetrating the ferroelectric layer FE and the channel layer SEL and filling the through holes with a conductive material. As shown in FIG. 13, the channel layer SEL and the ferroelectric layer FE may be node-separated into a first cell string CSTR1 and a second cell string CSTR2 by the first and second conductive pillars SLP and BLP.

The first conductive pillar SLP, the second conductive pillar BLP, and the second sacrificial layer SFL2 therebetween which are between the first and second electrode structures ST1 and ST2 may form a first through structure TRS1. The first through structures TRS1 between the first and second electrode structures ST1 and ST2 may be arranged in the first direction D1. Adjacent first through structures TRS1 may be spaced apart from each other with the first sacrificial layer SFL1 interposed therebetween.

The first conductive pillar SLP, and the second conductive pillar BLP, and the second sacrificial layer SFL2 therebetween which are between the second and third electrode structures ST2 and ST3 may form a second through structure TRS2. The second through structures TRS2 between the second and third electrode structures ST2 and ST3 may be arranged in the first direction D1. Adjacent second through structures TRS2 may be spaced apart from each other with the first sacrificial layer SFL1 interposed therebetween.

As various example embodiments, referring to FIG. 13, a first portion PA1 of a sidewall of the first conductive pillar SLP may be formed to be in contact with the channel layer SEL. A remaining second portion PA2 of the sidewall of the first conductive pillar SLP may be formed to be in contact with the first sacrificial layer SFL1.

Referring to FIGS. 15, 16A, 16B, and 16C, all of the first and second sacrificial layers SFL1 and SFL2 may be selectively removed. As the first sacrificial layers SFL1 are removed, second air gaps AG2 may be respectively formed. As the second sacrificial layers SFL2 are removed, first air gaps AG1 may be formed, respectively.

The first and second conductive pillars SLP and BLP and the first air gap AG1 therebetween which are between the first and second electrode structures ST1 and ST2 may form the first through structure TRS1. The first conductive pillar SLP and the second conductive pillar BLP and the first air gap AG1 therebetween which are between the second and third electrode structures ST2 and ST3 may form the second through structure TRS2.

Adjacent first through structures TRS1 may be spaced apart from each other with the second air gap AG2 interposed therebetween. Adjacent second through structures TRS2 may be spaced apart from each other with the second air gap AG2 interposed therebetween.

Figure 15:
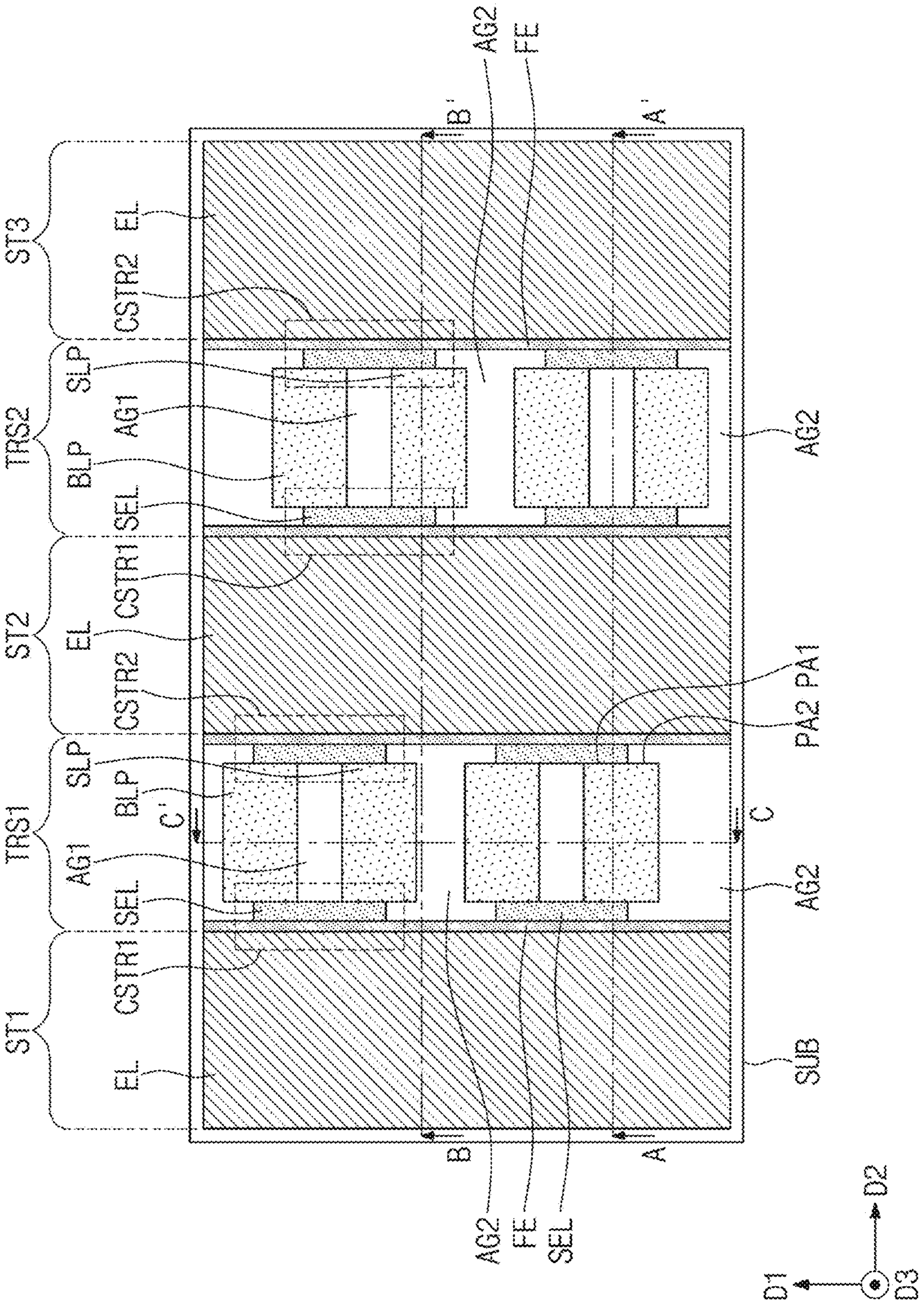
Figure 16A:
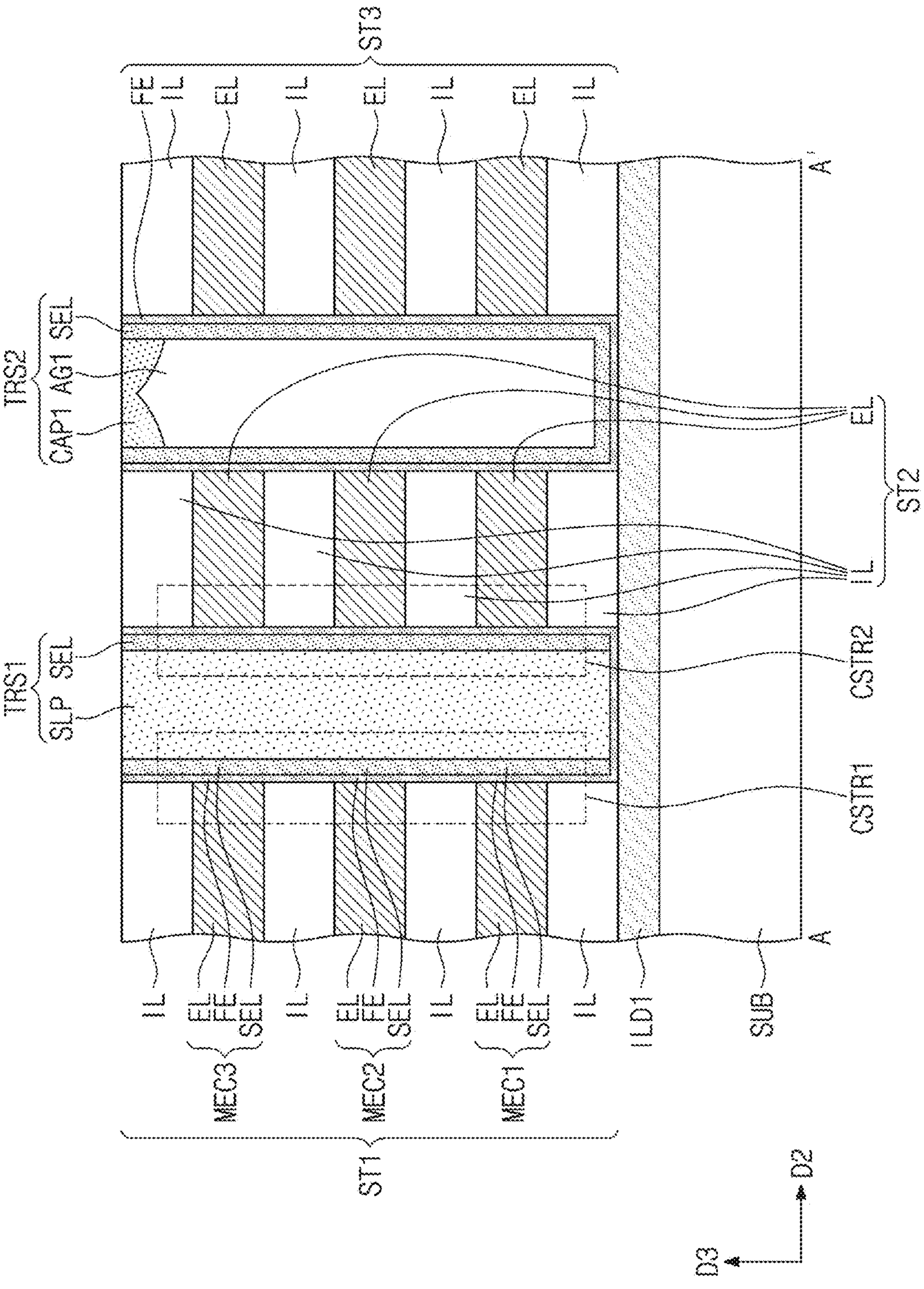
Figure 16B:
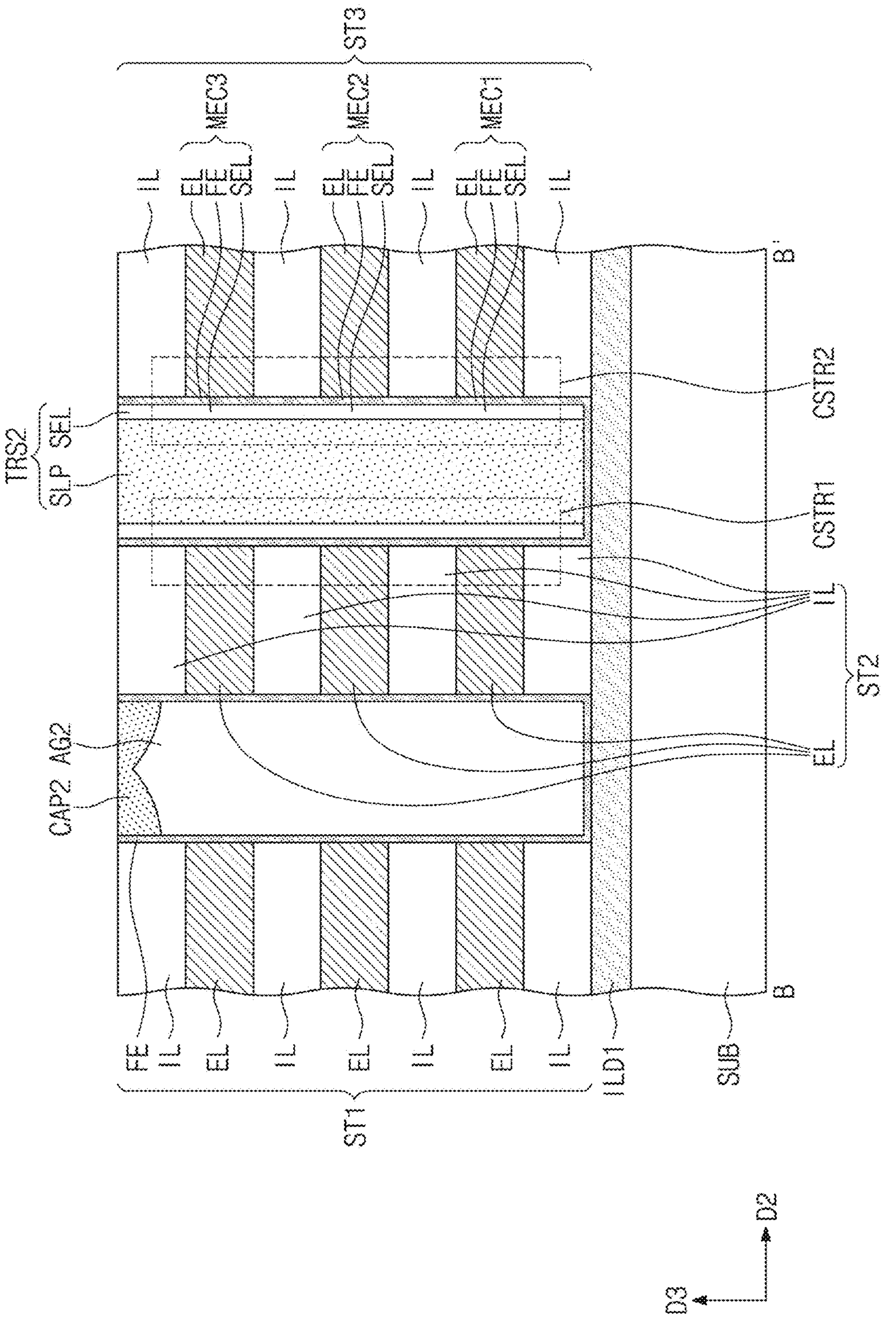
Figure 16C:
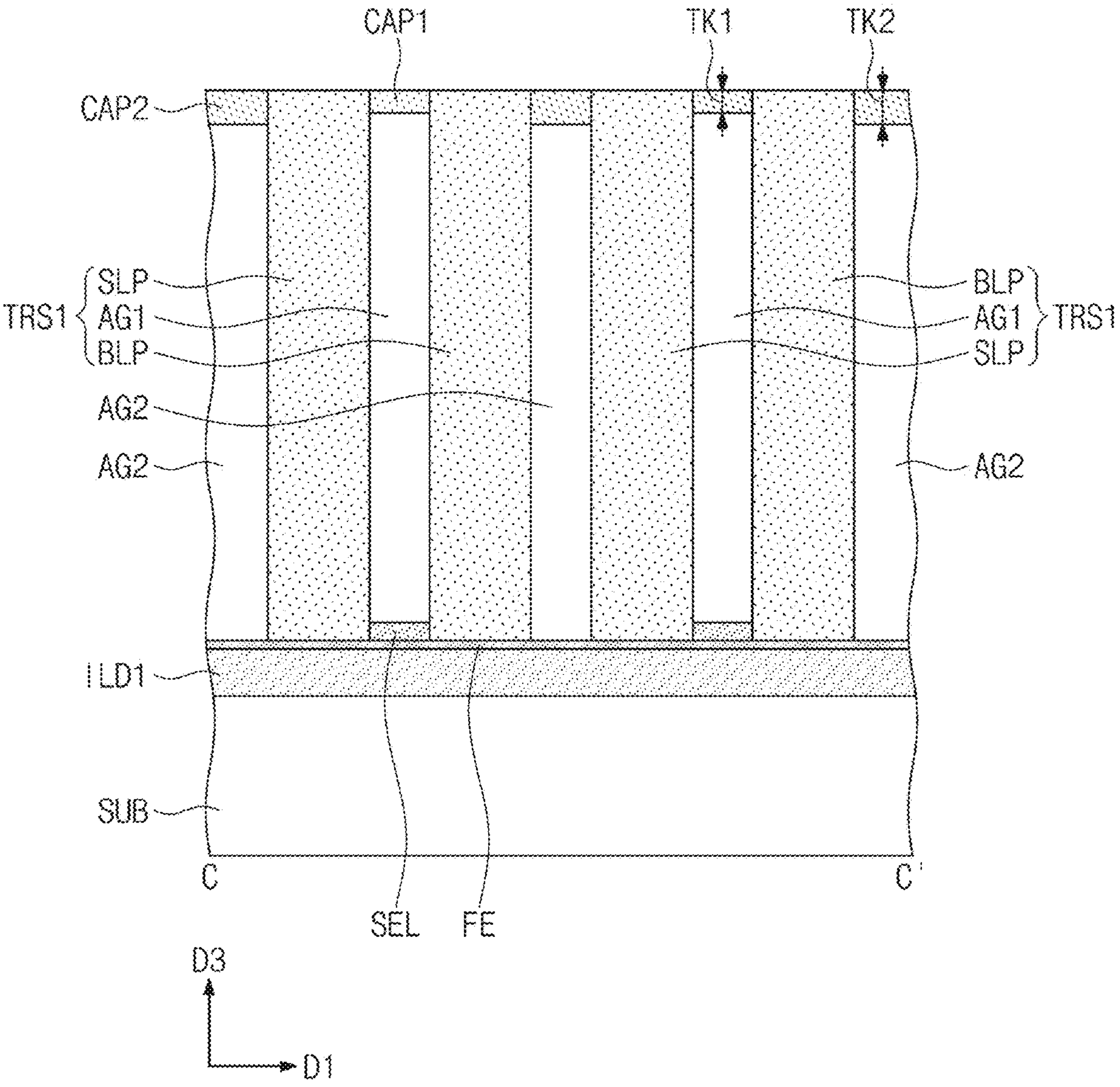
FIG. 16C is a cross-sectional view taken along line C-C' of FIG. 15.

As various example embodiments, referring to FIG. 15, the first portion PA1 of the sidewall of the first conductive pillar SLP may be formed to be in contact with the channel layer SEL. The remaining second portion PA2 of the sidewall of the first conductive pillar SLP may be formed to be in contact with the second air gap AG2. This is because the second air gap AG2 is defined in a region where the first sacrificial layer SFL1 is removed.

A first capping layer CAP1 may be formed on each of the first air gaps AG1. The first capping layer CAP1 may seal the first air gap AG1 from the outside. A second capping layer CAP2 may be formed on each of the second air gaps AG2. The second capping layer CAP2 may seal the second air gap AG2 from the outside.

The first and second capping layers CAP1 and CAP2 may be formed together, e.g. concurrently or at the same time or within the same process chamber. Forming the first and second capping layers CAP1 and CAP2 may include performing a deposition process having a very large step coverage on the first and second air gaps AG1 and AG2. An insulating material may be intentionally deposited on the first and second air gaps AG1 and AG2 to form a large overhang (or bottle neck). As a result, the first and second capping layers CAP1 and CAP2 capping upper portions of the first and second air gaps AG1 and AG2 may be formed, respectively.

Referring to FIG. 16C, the first and second capping layers CAP1 and CAP2 may have different minimum thicknesses. For example, a minimum thickness TK1 of the first capping layer CAP1 may be smaller than a minimum thickness TK2 of the second capping layer CAP2.

Referring back to FIGS. 2 and 3A to 3C, a second interlayer insulating layer ILD2 may be formed on the first to third electrode structures ST1, ST2, and ST3. A plurality of wirings extending in the second direction D2 may be formed on the second interlayer insulating layer ILD2. The plurality of wirings may include first and second bit lines BL1 and BL2 and first and second source lines SL1 and SL2. Contacts CNT electrically connecting the first source and bit lines SL1 and BL1 and the first through structure TRS1 may be formed. Contacts CNT electrically connecting the second source and bit lines SL2 and BL2 and the second through structure TRS2 may be formed.

In some example embodiments to be described later, detailed descriptions of technical features overlapping with those previously described with reference to FIGS. 2, 3A to 3C, and 4 will be omitted, and differences will be described in detail.

Figure 17:
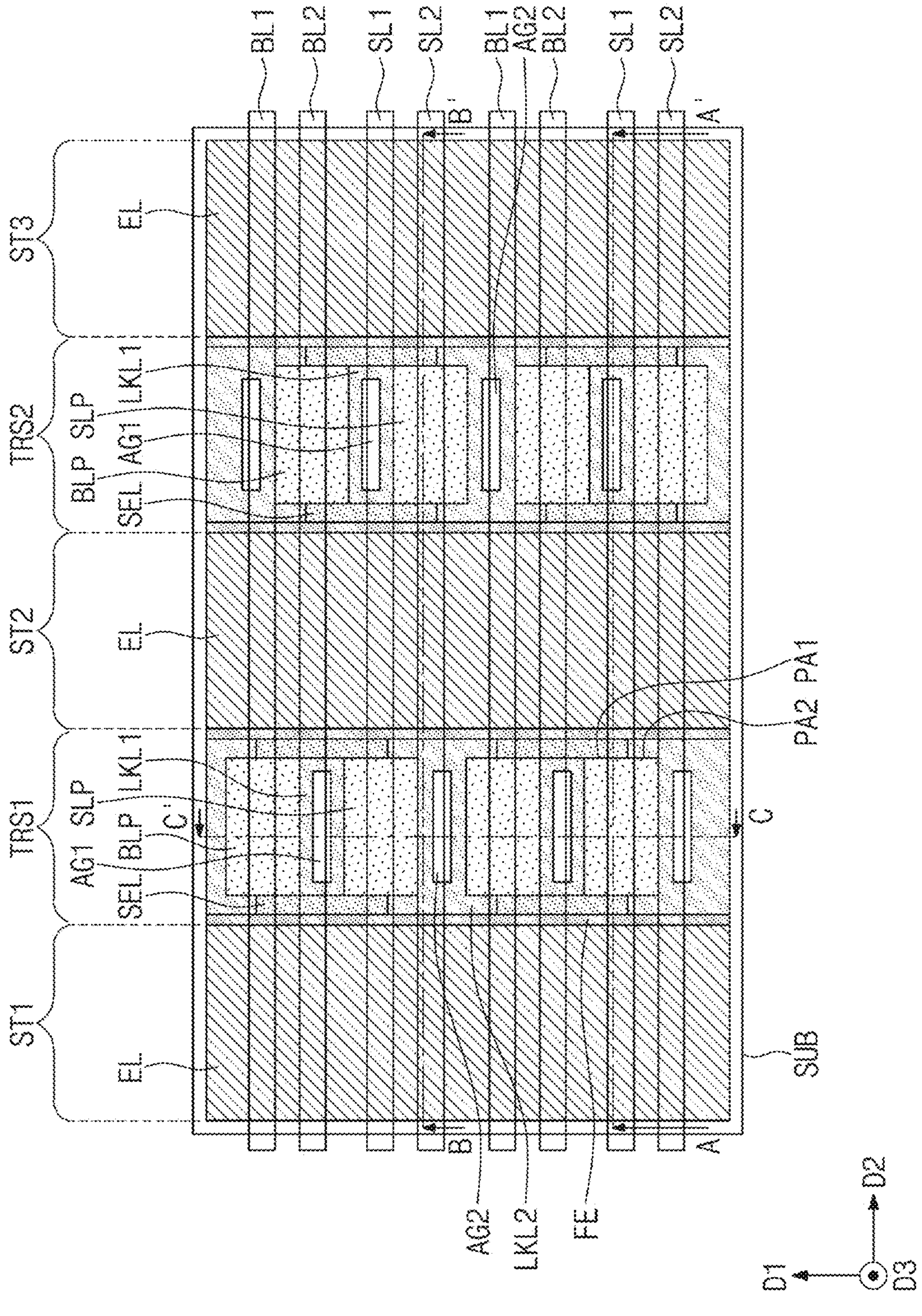
FIG. 17 is a plan view of a three-dimensional semiconductor memory device according to another embodiment of the inventive concept.
Figure 18A:
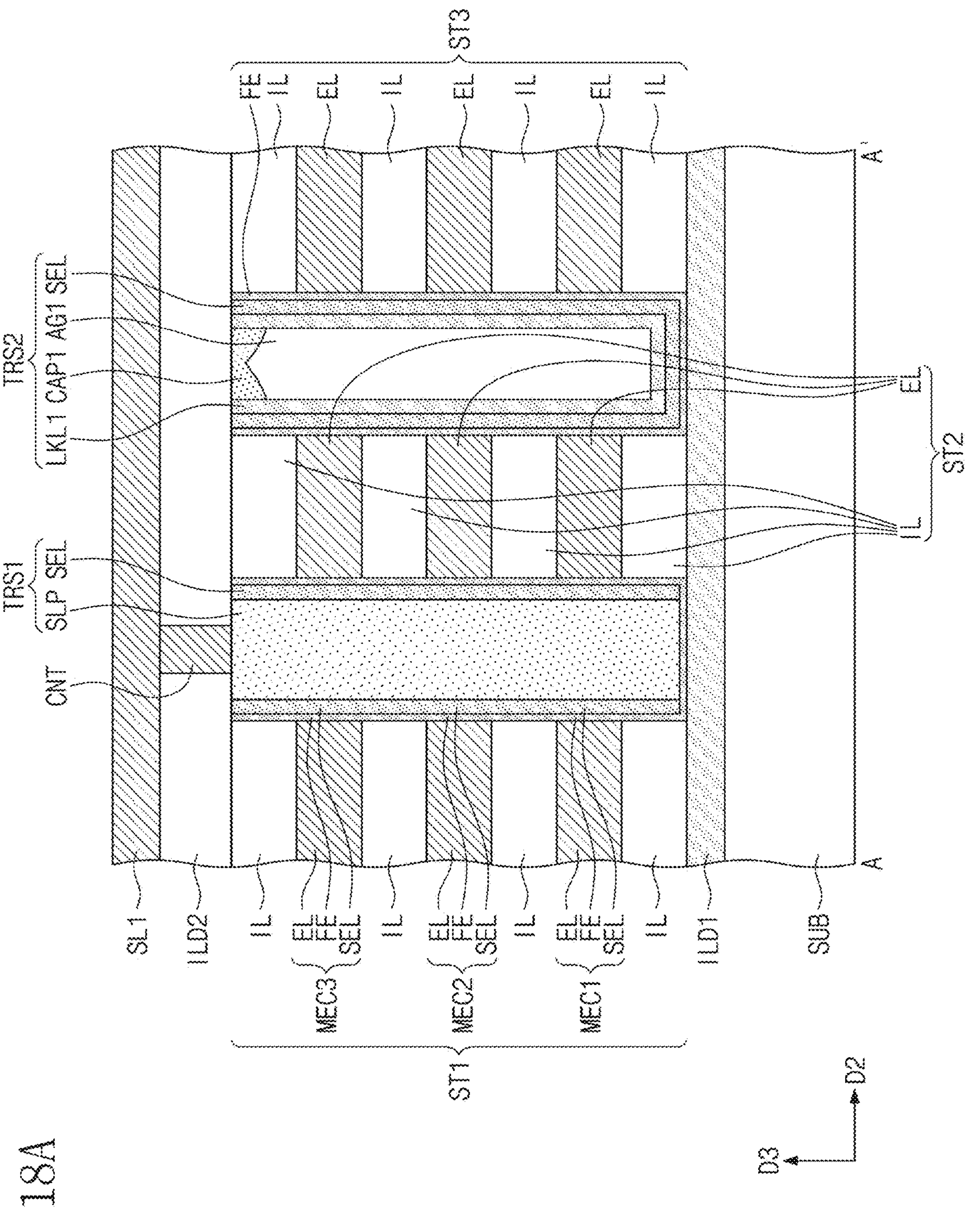
FIG. 18A is a cross-sectional view taken along line A-A' of FIG. 17.
Figure 18B:
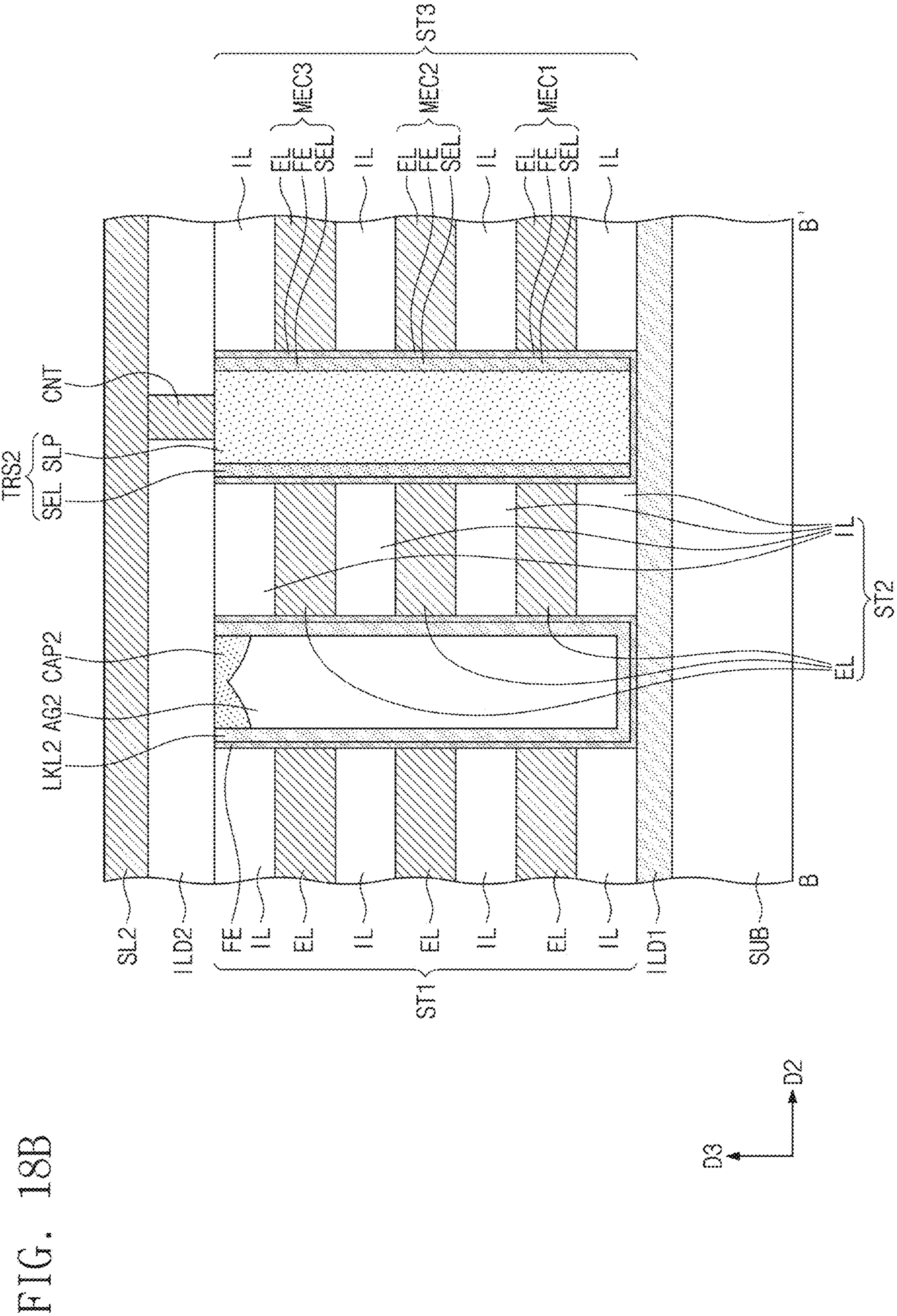
FIG. 18B is a cross-sectional view taken along line B-B' of FIG. 17.
Figure 18C:
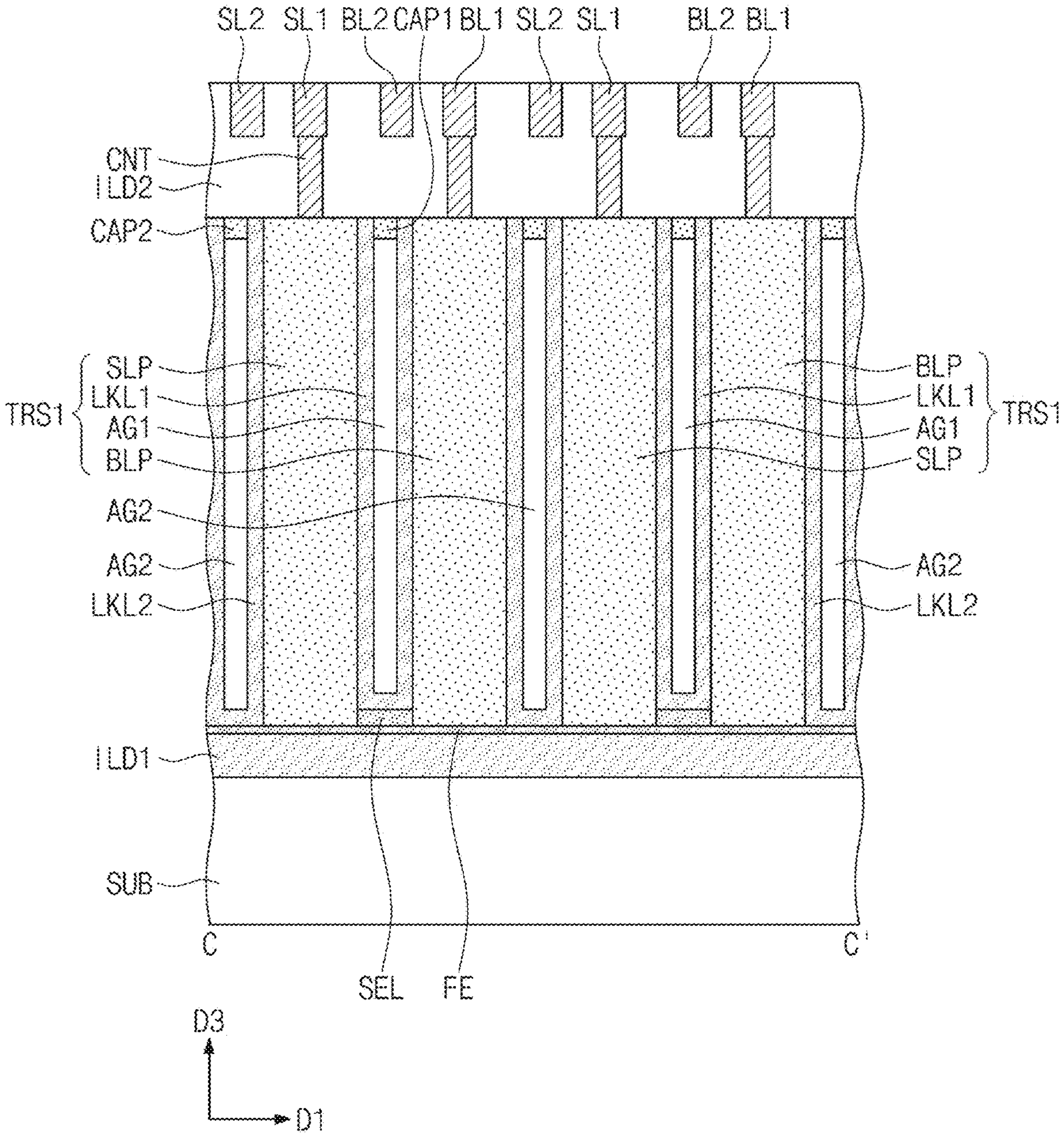
FIG. 18C is a cross-sectional view taken along line C-C' of FIG. 17.

FIG. 17 is a plan view of a three-dimensional semiconductor memory device according to another embodiment of the inventive concept. FIG. 18A is a cross-sectional view taken along line A-A' of FIG. 17. FIG. 18B is a cross-sectional view taken along line B-B' of FIG. 17. FIG. 18C is a cross-sectional view taken along line C-C' of FIG. 17. Referring to FIGS. 17 and 18A to 18C, a first spacer layer LKL1 surrounding the first air gap AG1 may be provided. A second spacer layer LKL2 surrounding the second air gap AG2 may be provided.

The first spacer layer LKL1 may be interposed between the first and second conductive pillars SLP and BLP of the through structures TRS1 and TRS2. The first spacer layer LKL1 may conformally fill a space between the first and second conductive pillars SLP and BLP of the through structures TRS1 and TRS2, and thus the first air gap AG1 may be more stably formed. For example, the first capping layer CAP1 may be selectively formed only on an upper portion of the first air gap AG1 by the first spacer layer LKL1.

The second spacer layer LKL2 may be interposed between adjacent through structures TRS1 and TRS2. The second spacer layer LKL2 may conformally fill a space between the adjacent through structures TRS1 and TRS2, and thus the second air gap AG2 may be more stably formed. For example, the second capping layer CAP2 may be selectively formed only on an upper portion of the second air gap AG2 by the second spacer layer LKL2.

As various example embodiments, referring to FIG. 17, the first portion PA1 of the sidewall of the first conductive pillar SLP may be in contact with the channel layer SEL. The remaining second portion PA2 of the sidewall of the first conductive pillar SLP may be in contact with the second spacer layer LKL2.

The first and second spacer layers LKL1 and LKL2 may include a low-k material. A dielectric constant of the first and second spacer layers LKL1 and LKL2 may be in the range of 1.8 to 2.5. For example, the first and second spacer layers LKL1 and LKL2 may include at least one low-k material selected from the group consisting of or including SiO, SiOC, SiON, SiOCN, and SiOCH. The low-k material may be porous; however, example embodiments are not limited thereto.

Figure 19:
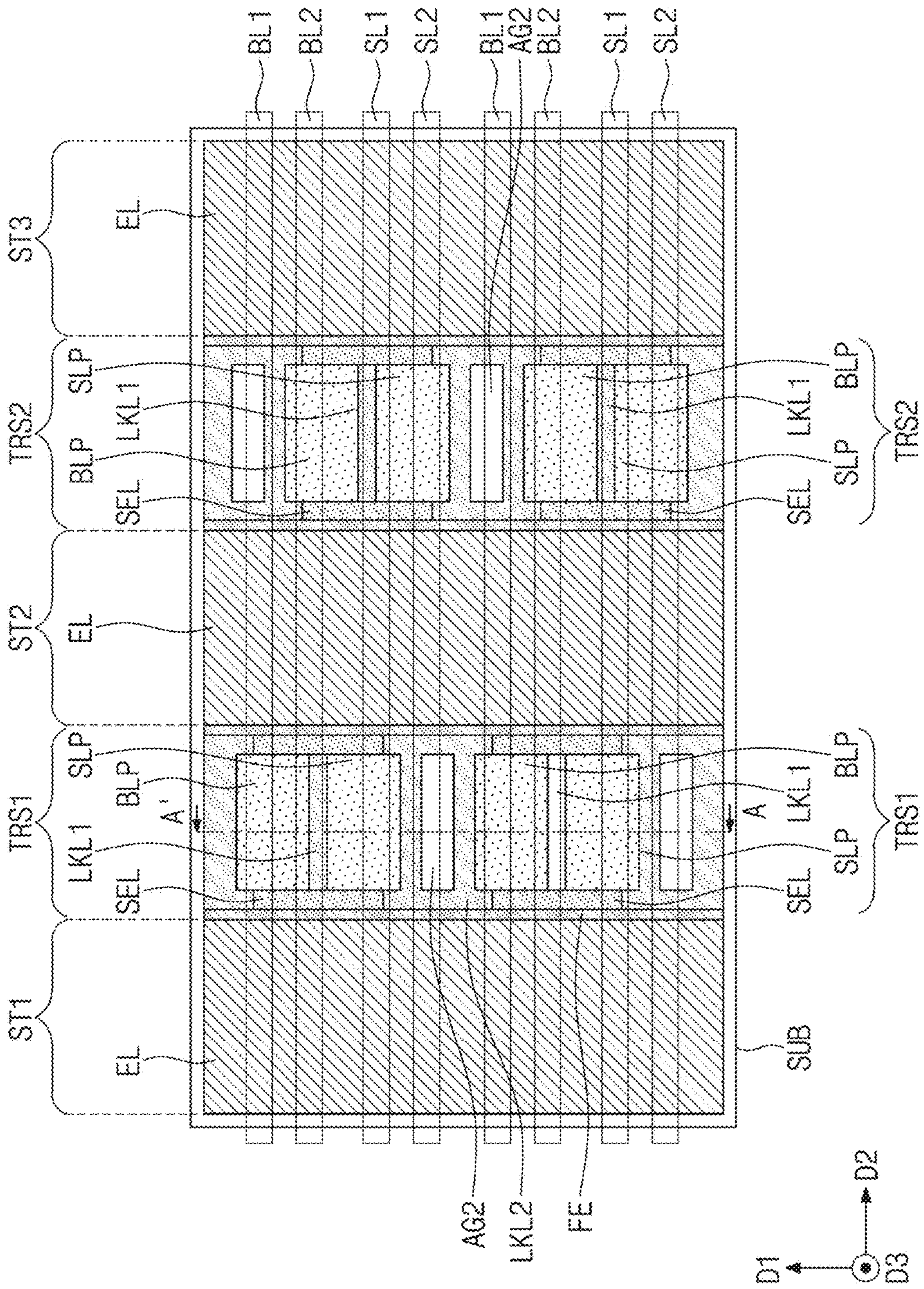
FIG. 19 is a plan view of a three-dimensional semiconductor memory device according to some example embodiments.
Figure 20:
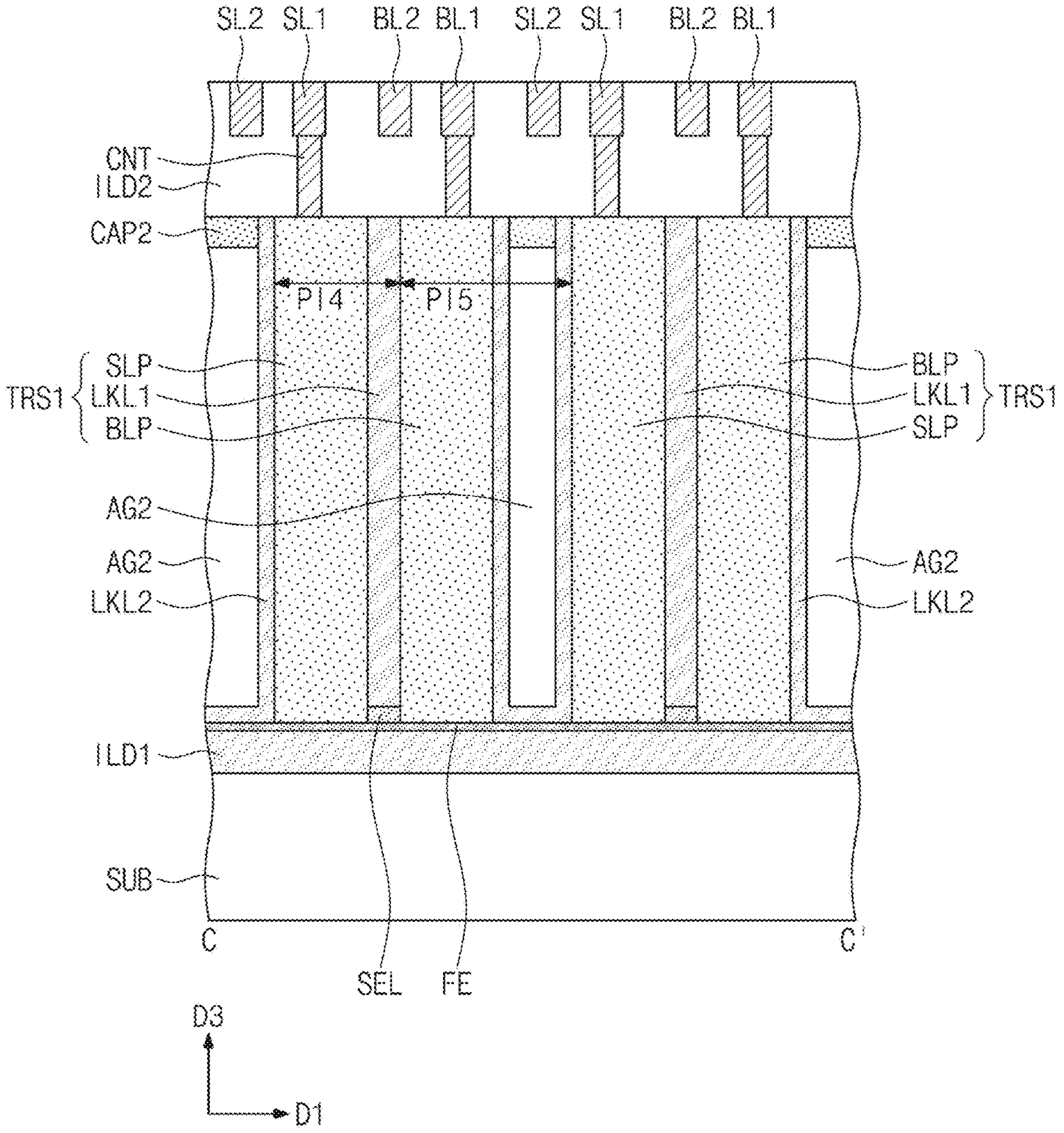
FIG. 20 is a cross-sectional view taken along line A-A' of FIG. 19.

FIG. 19 is a plan view of a three-dimensional semiconductor memory device according to another embodiment of the inventive concept. FIG. 20 is a cross-sectional view taken along line A-A of FIG. 19. Referring to FIGS. 19 and 20, a distance between the first and second conductive pillars SLP and BLP of the through structures TRS1 and TRS2 may be different from a distance between the adjacent through structures TRS1 and TRS2. For example, the distance between the first and second conductive pillars SLP and BLP of the first through structure TRS1 may be a fourth pitch PI4. A distance between the second conductive pillar BLP of the first through structure TRS1 and the first conductive pillar SLP of another first through structure TRS1 adjacent thereto may be a fifth pitch PI5. The fourth pitch PI4 may be smaller than the fifth pitch PI5.

A first spacer layer LKL1 may be provided between the first and second conductive pillars SLP and BLP of the first through structure TRS1. The first air gap AG1 and the first capping layer CAP1 may be omitted between the first and second conductive pillars SLP and BLP of the first through structure TRS1. This may be because the distance PI4 between the first and second conductive pillars SLP and BLP of the first through structure TRS1 is relatively small, and thus the first spacer layer LKL1 may be completely fill a space between the first and second conductive pillars SLP and BLP. On the other hand, a second spacer layer LKL2, a second air gap AG2, and a second capping layer CAP2 may be provided between adjacent first through structures TRS1.

Figure 21:
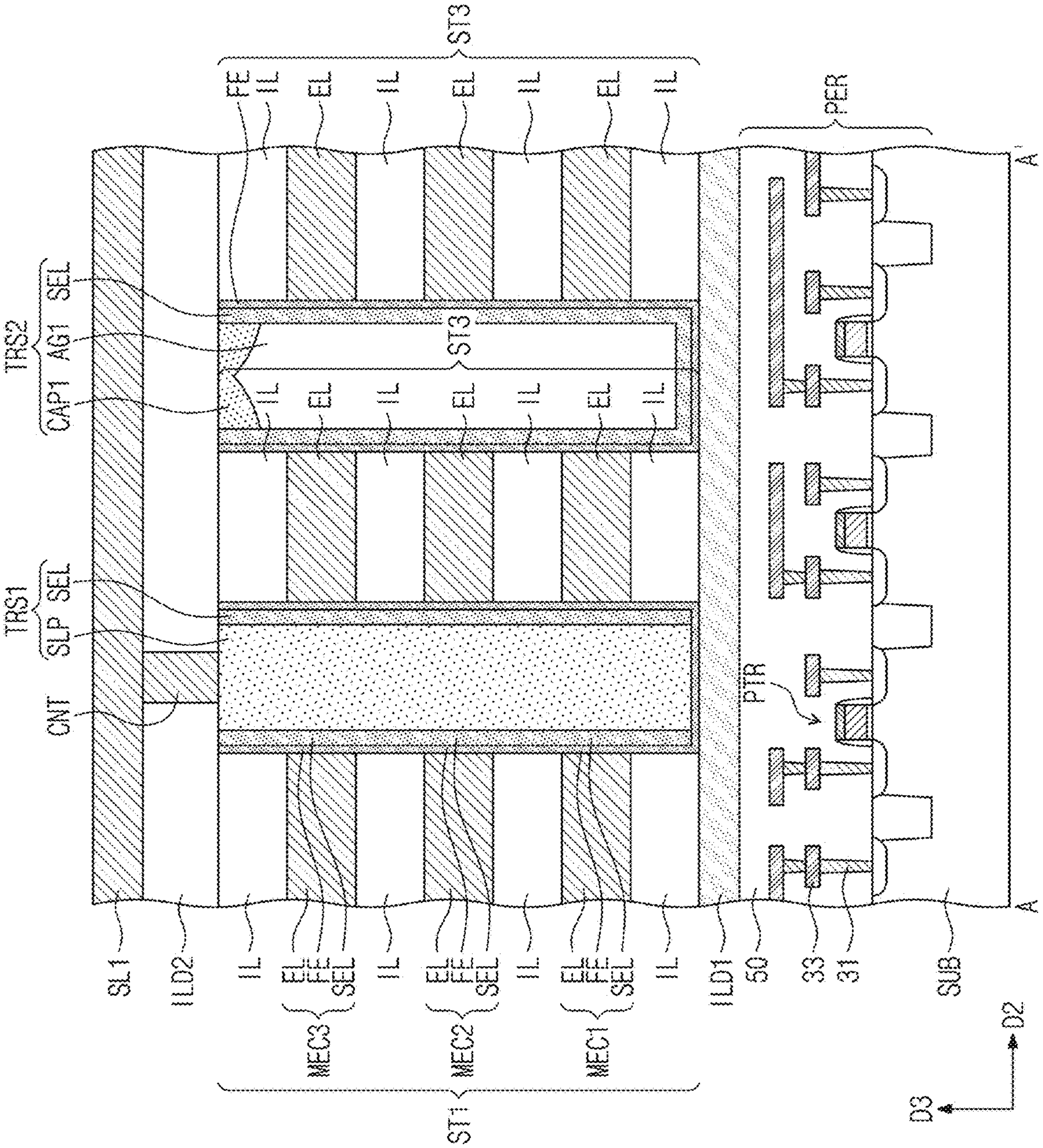
FIGS. 21, 22 and 23 are cross-sectional views of three-dimensional semiconductor memory devices according to some example embodiments, respectively.
Figure 22:
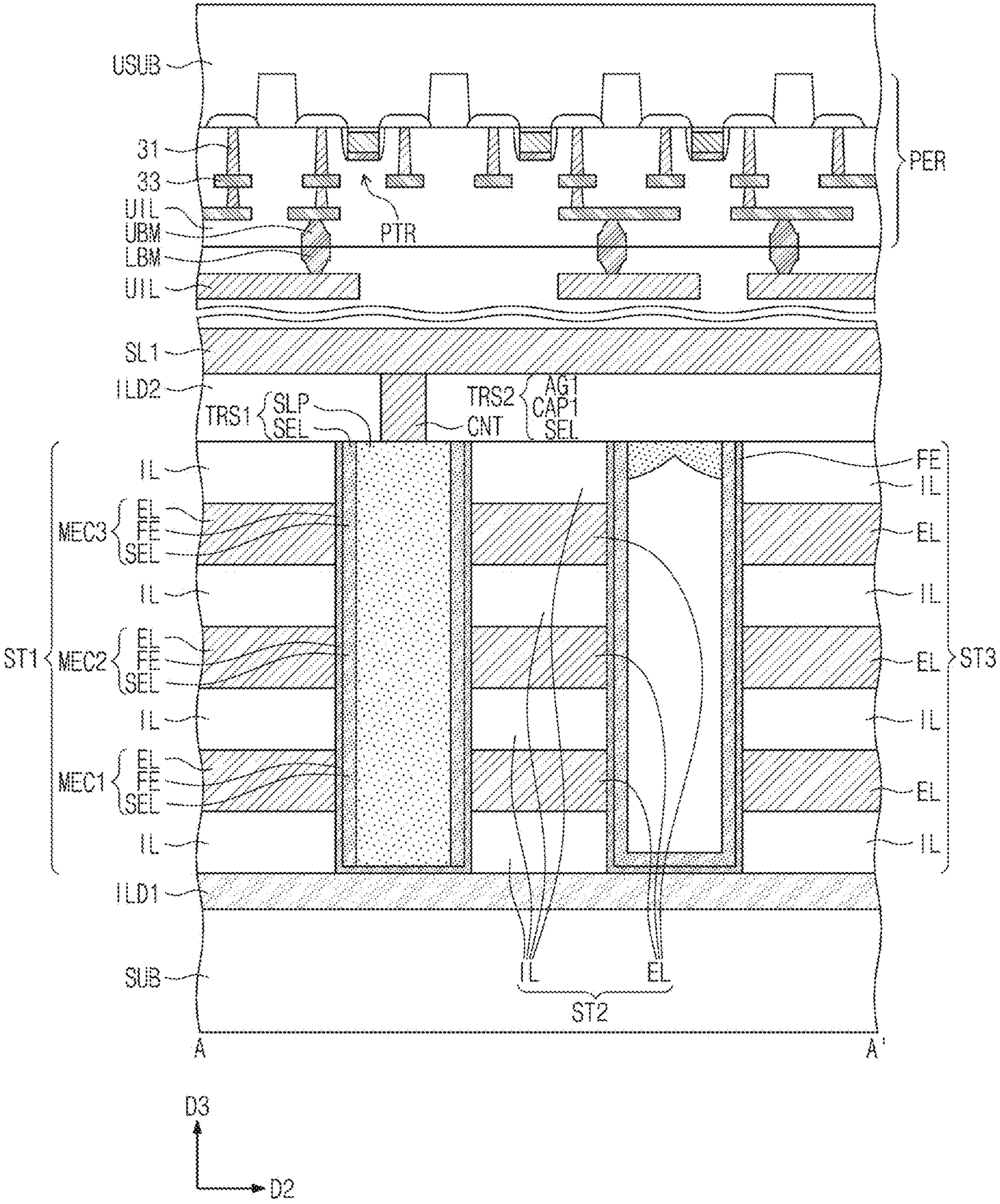
Figure 23:
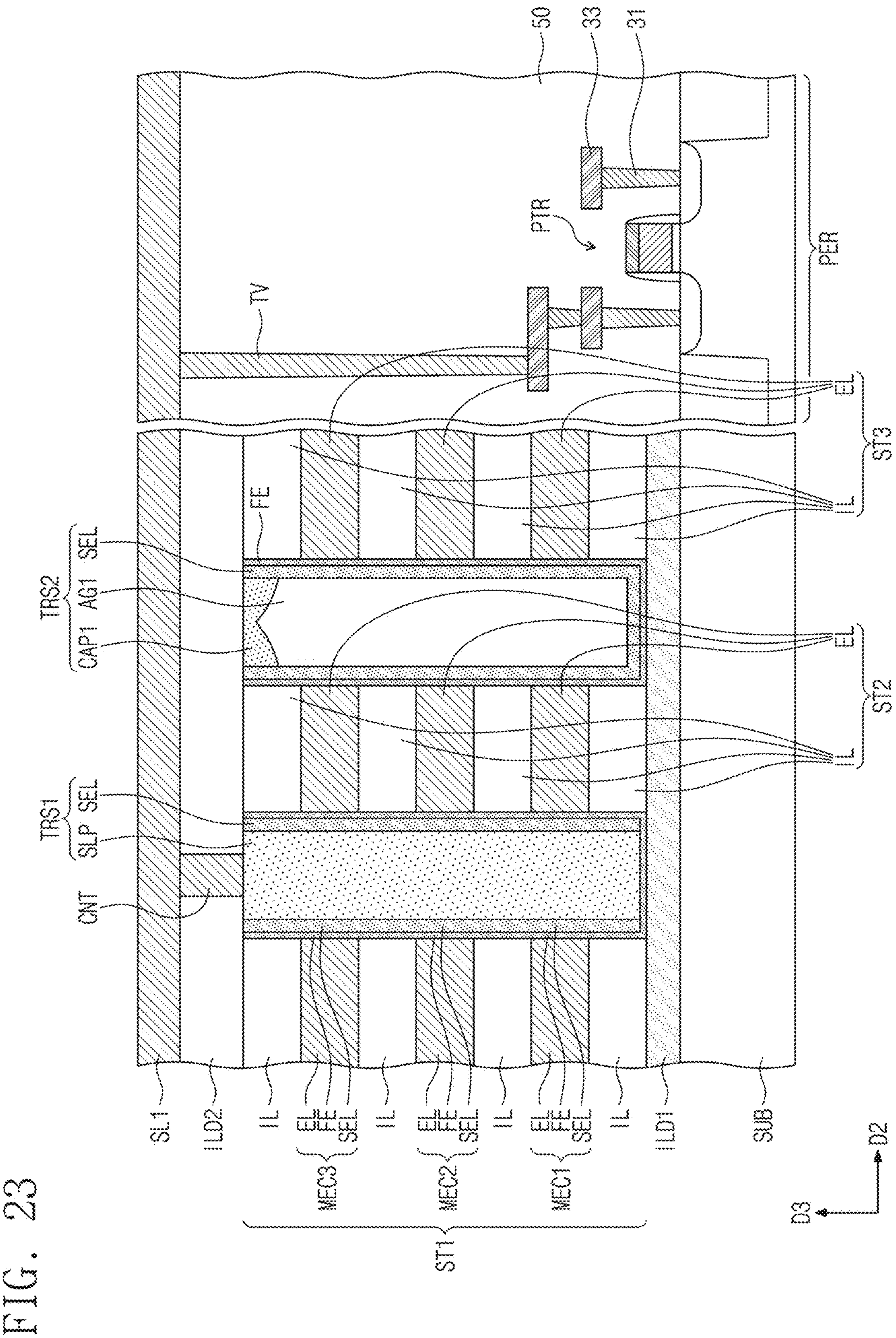

FIGS. 21, 22, and 23 are cross-sectional views of three-dimensional semiconductor memory devices according to some example embodiments of the inventive concept, respectively.

Referring to FIG. 21, a peripheral circuit layer PER may be provided on the substrate SUB. The peripheral circuit layer PER may be interposed between the substrate SUB and the first interlayer insulating layer ILD1. For example, the peripheral circuit layer PER may be provided below a memory cell array including the electrode structures ST1, ST2, and ST3. The semiconductor memory device according to various example embodiments may have a cell on peri (COP) structure.

The peripheral circuit layer PER may include a plurality of peripheral transistors PTR and peripheral wirings 33 on the substrate SUB. The peripheral transistors PTR and the peripheral wirings 33 may be covered by an interlayer insulating layer 50. The peripheral wirings 33 may be provided on the peripheral transistors PTR and connected to the peripheral transistors PTR through contacts 31. The peripheral transistors PTR may include planar transistors and/or three-dimensional transistors; example embodiments are not limited thereto.

In various example embodiments, the peripheral circuit layer PER may include one or more of sense amplifiers, row decoders, and/or sub-word line drivers which are electrically connected to the memory cells MEC1, MEC2, and MEC3.

Referring to FIG. 22, a peripheral circuit layer PER and an upper substrate USUB may be provided on the memory cell array including the electrode structures ST1, ST2, and ST3. A description of the peripheral circuit layer PER may be substantially the same as that previously described with reference to FIG. 21. The semiconductor memory device according to various example embodiments may have a chip to chip (C2C) structure.

The peripheral circuit layer PER may be provided to face the substrate SUB. That is, the upper substrate USUB may be positioned on an uppermost part and exposed to the outside. Upper interconnections UIL and lower bonding metals LBM may be provided on an uppermost part of the memory cell array layer. The lower bonding metals LBM may be provided on the upper interconnections UIL, respectively. The upper interconnections UIL may be provided in an uppermost metal layer above the first bit and source lines BL1 and SL1 and the second bit and source lines BL2 and SL2.

Upper bonding metals UBM may be provided at a lowermost part of the peripheral circuit layer PER. The upper bonding metals UBM may be connected to the peripheral wirings 33, respectively. Each of the lower bonding metals LBM may be connected to a corresponding upper bonding metal UBM by a metal bonding manner. For example, the metal bonding manner may be a Cu—Cu bonding manner. As the lower bonding metal LBM and the upper bonding metal UBM are connected to each other, the memory cells MEC1, MEC2, and MEC3 and the peripheral circuit layer PER may be connected to each other.

Referring to FIG. 23, a peripheral circuit layer PER may be provided on a peripheral area of the substrate SUB. The peripheral circuit layer PER may be disposed next to the memory cell array including the electrode structures ST1, ST2, and ST3. A description of the peripheral circuit layer PER may be substantially the same as that previously described with reference to FIG. 21.

The first bit and source lines BL1 and SL1 and the second bit and source lines BL2 and SL2 may extend from the memory cell array onto the peripheral circuit layer PER. The peripheral wiring 33 of the peripheral circuit layer PER may be electrically connected to the lines BL1, SL1, BL2, and SL2 through through-silicon vias TV.

In the three-dimensional semiconductor memory device of example embodiments, the air gap may be provided between the first and second conductive pillars adjacent to each other. The air gap may greatly reduce coupling between the first and second conductive pillars adjacent to each other. The electrical characteristics of the semiconductor device of the inventive concept may be improved through the air gap.

While various example embodiments are described above, a person of ordinary skill in the art may understand that many modifications and variations are made without departing from the spirit and scope of inventive concepts defined in the following claims. Accordingly, example embodiments should be considered in all respects as illustrative and not restrictive, with the spirit and scope of the inventive concept being indicated by the appended claims. Further example embodiments are not necessarily mutually exclusive. For example, some example embodiments may include one or more features described with reference to one or more claims, and may also include one or more other features described with reference to one or more other claims.

What is claimed is:

1. A three-dimensional semiconductor memory device comprising:

first through structures on a substrate, the first through structures arranged in a first direction;

an electrode adjacent to at least one of the first through structures and extending horizontally in the first direction along the first through structures; and a ferroelectric layer interposed between the electrode and at least one of the first through structures, wherein each of the first through structures includes, a first conductive pillar and a second conductive pillar spaced apart from each other in the first direction, and a channel layer extending from a sidewall of the first conductive pillar to a sidewall of the second conductive pillar, the channel layer interposed between the ferroelectric layer, the first conductive pillar, and the second conductive pillar, the first conductive pillar and the second conductive pillar being spaced apart from each other in the first direction and defining a first air gap, wherein adjacent ones of the first through structures define a second air gap, wherein the first air gap vertically overlaps at least a portion of the channel layer, and wherein the second air gap does not vertically overlap the channel layer.

2. The three-dimensional semiconductor memory device of claim 1, further comprising:

a first capping layer on an upper portion of the first air gap and sealing the first air gap; and a second capping layer on an upper portion of the second air gap and sealing the second air gap.

3. The three-dimensional semiconductor memory device of claim 2, wherein a thickness of the first capping layer and a thickness of the second capping layer are different from each other.

4. The three-dimensional semiconductor memory device of claim 1, wherein a width of the first air gap in a second direction and a width of the second air gap in the second direction are different from each other.

5. The three-dimensional semiconductor memory device of claim 1, wherein the channel layer includes at least one of a semiconductor material, an amorphous oxide semiconductor, or a two-dimensional material.

6. The three-dimensional semiconductor memory device of claim 1, wherein the ferroelectric layer includes a Hf-based oxide containing at least one impurity selected from Zr, Si, Al, Y, Gd, La, Sc, and Sr.

7. The three-dimensional semiconductor memory device of claim 1, wherein the ferroelectric layer includes a first layer and a second layer sequentially stacked, one of the first layer and the second layers includes a ferroelectric, and another one of the first layer and the second layers is a paraelectric.

8. The three-dimensional semiconductor memory device of claim 1, further comprising:

second through structures spaced apart from the first through structures in a second direction with the electrode therebetween, wherein the second through structures are arranged in the first direction, and each of the first through structures is offset from a second through structure among the second through structures that is adjacent thereto in the first direction.

9. The three-dimensional semiconductor memory device of claim 1, further comprising:

a first spacer layer surrounding the first air gap; and a second spacer layer surrounding the second air gap, wherein the first spacer layer and the second spacer layers have a dielectric constant of 1.8 to 2.5.

10. The three-dimensional semiconductor memory device of claim 1, further comprising:

a peripheral circuit layer on the substrate; and an interlayer insulating layer between the peripheral circuit layer and the first through structures, wherein the peripheral circuit layer includes peripheral transistors.

11. A three-dimensional semiconductor memory device comprising:

an electrode structure on a substrate, the electrode structure including a plurality of electrodes spaced apart from each other and stacked on the substrate;

first conductive pillars penetrating the electrode structure;

second conductive pillars penetrating the electrode structure, the first conductive pillars and the second conductive pillars alternately arranged in a first direction;

adjacent ones of the first conductive pillars and the second conductive pillars having air gaps interposed therebetween;

a ferroelectric layer interposed between the first conductive pillars, the second conductive pillars, and the electrode structure; and a channel layer interposed between the first conductive pillars, the second conductive pillars, and the ferroelectric layer, wherein a first air gap among the air gaps vertically overlaps at least a portion of the channel layer, and a second air gap among the air gaps does not vertically overlap the channel layer.

12. The three-dimensional semiconductor memory device of claim 11, wherein the channel layer connects a first one of the first conductive pillars and a second one of the second conductive pillars that are adjacent to each other, and wherein the air gaps include, the first air gap surrounded by the channel layer, and the second air gap surrounded by the ferroelectric layer.

13. The three-dimensional semiconductor memory device of claim 12, further comprising:

a first capping layer selectively provided on an upper portion of the first air gap to seal the first air gap; and a second capping layer selectively provided on an upper portion of the second air gap to seal the second air gap.

14. The three-dimensional semiconductor memory device of claim 13, wherein a minimum thickness of the first capping layer and a minimum thickness of the second capping layer are different from each other.

15. The three-dimensional semiconductor memory device of claim 11, further comprising:

a spacer layer surrounding each of the air gaps, wherein the spacer layer has a dielectric constant of 1.8 to 2.5.

16. A three-dimensional semiconductor memory device comprising:

a first electrode structure and a second electrode structure on a substrate, each of the first electrode structure and the second electrode structures including a plurality of electrodes stacked on the substrate and spaced apart from each other, the first electrode structure and the second electrode structures extending in a first direction, and the first electrode structure and the second electrode structures being spaced apart from each other in a second direction crossing the first direction;

a through structure between the first electrode structure and the second electrode structures;

a first cell string between the first electrode structure and the through structure;

a second cell string between the second electrode structure and the through structure; and the first cell string and the second cell strings defining a first air gap between the first cell string and the second cell string, wherein the through structure includes a first conductive pillar and a second conductive pillar spaced apart from each other in the first direction;

wherein each of the first cell string and the second cell strings includes:

a channel layer connecting the first conductive pillar and the second conductive pillars; and a ferroelectric layer between the channel layer and an adjacent one of the first electrode structure and the second electrode structures, wherein the first air gap is surrounded by the channel layer of the first cell string, the channel layer of the second cell string, the first conductive pillar, and the second conductive pillar, and the first air gap vertically overlaps at least a portion of the channel laver.

17. The three-dimensional semiconductor memory device of claim 16, wherein the through structure includes a plurality of through structures, the plurality of through structures are arranged in the first direction, and a second air gap is defined between adjacent through structures among the plurality of through structures.

18. The three-dimensional semiconductor memory device of claim 17, further comprising:

a first capping layer on an upper portion of the first air gap to seal the first air gap; and a second capping layer on an upper portion of the second air gap to seal the second air gap.

19. The three-dimensional semiconductor memory device of claim 18, wherein a thickness of the first capping layer and a thickness of the second capping layer are different from each other.

20. The three-dimensional semiconductor memory device of claim 16, further comprising:

a spacer layer surrounding the first air gap, wherein the spacer layer has a dielectric constant of 1.8 to 2.5.

* * * * *